(12) United States Patent
Nishimura et al.

(10) Patent No.: US 7,880,276 B2
(45) Date of Patent: Feb. 1, 2011

(54) WIRING BOARD AND SEMICONDUCTOR DEVICE

(75) Inventors: Takao Nishimura, Kawasaki (JP);
Kazuyuki Aiba, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 334 days.

(21) Appl. No.: 11/969,402

(22) Filed: Jan. 4, 2008

(65) Prior Publication Data
US 2008/0179738 A1 Jul. 31, 2008

(30) Foreign Application Priority Data
Jan. 30, 2007 (JP) .............................. 2007-020081

(51) Int. Cl.
*H01L 23/495* (2006.01)
(52) U.S. Cl. ................. 257/667; 257/E23.01; 257/737; 257/787; 438/123; 438/124
(58) Field of Classification Search .......... 257/E21.515, 257/E23.01, 737, 783, 784, 787, 701–704, 257/778, 667, 678, 687, 690; 438/123, 124, 438/127, 108, 112, 118
See application file for complete search history.

(56) References Cited

U.S. PATENT DOCUMENTS

| | | | | |
|---|---|---|---|---|
| 5,120,678 A * | 6/1992 | Moore et al. | ................... | 29/840 |
| 5,855,821 A * | 1/1999 | Chau et al. | ................... | 252/514 |
| 5,900,581 A * | 5/1999 | Ootake | ........................ | 174/523 |
| 5,942,798 A * | 8/1999 | Chiu | ........................... | 257/737 |
| 6,020,221 A * | 2/2000 | Lim et al. | .................... | 438/125 |
| 6,048,656 A * | 4/2000 | Akram et al. | ................ | 438/118 |
| 6,291,264 B1 * | 9/2001 | Tang et al. | ................... | 438/106 |
| 6,368,895 B1 * | 4/2002 | Hori | ........................... | 438/108 |
| 6,459,144 B1 * | 10/2002 | Pu et al. | ...................... | 257/667 |
| 6,498,054 B1 * | 12/2002 | Chiu et al. | ................... | 438/108 |
| 6,545,869 B2 * | 4/2003 | Bonitz et al. | ................ | 361/704 |
| 6,731,010 B2 * | 5/2004 | Horiuchi et al. | ............. | 257/777 |
| 6,762,509 B2 * | 7/2004 | Hilton et al. | ................ | 257/787 |
| 6,794,749 B2 * | 9/2004 | Akram | ........................ | 257/718 |
| 6,853,089 B2 * | 2/2005 | Ujiie et al. | ................... | 257/783 |
| 6,881,607 B2 * | 4/2005 | Farnworth | .................. | 438/106 |
| 7,015,592 B2 * | 3/2006 | Starkston et al. | ............ | 257/787 |
| 7,432,602 B2 * | 10/2008 | Kuramochi | ................. | 257/783 |

FOREIGN PATENT DOCUMENTS

JP     8-97535 A     4/1996

(Continued)

OTHER PUBLICATIONS

Korean Office Action Dated May 21, 2009, issued in corresponding Korean Application No. 10-2008-0008433.

*Primary Examiner*—Chris Chu
(74) *Attorney, Agent, or Firm*—Fujitsu Patent Center

(57) ABSTRACT

A wiring board where an electronic component is mounted on a main surface via a bump and at least a part of the periphery of the electronic component is covered with resin, the wiring board includes a dam provided at least at a part of the periphery of an area where the electronic component is mounted, on the main surface of the wiring board; wherein a surface of the dam contacting the resin has a configuration where a curved line is continuously formed.

13 Claims, 19 Drawing Sheets

FOREIGN PATENT DOCUMENTS

| | | |
|---|---|---|
| JP | 11-354554 A | 12/1999 |
| JP | 2000-340717 A | 12/2000 |
| JP | 2005-175113 A | 6/2005 |
| JP | 2005-276879 A | 10/2005 |
| JP | 2006-140327 A | 6/2006 |

* cited by examiner

WIRING BOARD AND SEMICONDUCTOR DEVICE

BACKGROUND OF THE INVENTION

1. Field of the Invention

The present invention generally relates to wiring boards and semiconductor devices. More specifically, the present invention relates to a wiring board where an electronic component such as a semiconductor element is mounted and a semiconductor device where the semiconductor element is mounted on the wiring board by bump connection.

2. Description of the Related Art

There is a semiconductor device where a semiconductor integrated circuit element (hereinafter "semiconductor element") is mounted on a wiring board by using convex (projection) outside connection terminals called wire bumps. Insulating resin such as glass epoxy resin is used for a base part of the wiring board. Conductive layers made of copper (Cu) or the like are selectively provided on a main surface of the wiring board. The convex (projection) outside connection terminals provided on a main surface of the semiconductor element are connected to the conductive layers of the wiring board. Outside connection terminals such as spherical electrode terminals are provided on surfaces of electrodes selectively formed on another main surface of the wiring board.

In the above-mentioned semiconductor device, the semiconductor element is mounted on the wiring board in a so-called flip-chip (face-down) state.

In such a flip-chip mounting structure, in order to protect a circuit forming surface of the semiconductor element and the convex (projection) outside connection terminals so that connection reliability is improved, an underfill material made of mainly epoxy resin is supplied to a space between the circuit surface of the semiconductor element and the wiring board, and a part or the entirety of an outer periphery side surface of the semiconductor element is covered with the underfill material. Under this structure, connection between the semiconductor element and the wiring board is reinforced.

The underfill material fills the space between the circuit surface of the semiconductor element and the wiring board from a periphery of the semiconductor element after the semiconductor element is mounted on and connected to the wiring board. Alternatively, the underfill material is applied on the wiring board in advance and the semiconductor element is mounted on the wiring board via the underfill material so that the underfill material is provided between the circuit surface of the semiconductor element and the wiring board.

It may be necessary to selectively provide the underfill material on the wiring board.

In order to selectively provide the underfill material on the wiring board, a structure shown in FIG. 1 is suggested, for example. That is, a dam is provided so as to surround a mounting area of the wiring board on an upper surface of the wiring board.

Here, FIG. 1 shows a state where the semiconductor element is flip-chip mounted on the wiring board and the dam is provided so as to surround the mounting area of the semiconductor element. FIG. 1(b) shows a cross section taken along a line X-X of FIG. 1(a). In addition, illustration of outside connection terminals selectively provided on a rear surface of the wiring board is omitted in FIG. 1.

In a semiconductor device 10 shown in FIG. 1, a semiconductor element 4 is flip-chip mounted on bonding terminals 2 provided on a main surface of the wiring board 1 via convex (projection) outside connection terminals 3. In addition, an underfill material 5 is supplied and provided in a space between the semiconductor element 4 and the main surface of the wiring board 1 and at an outer periphery side surface of the semiconductor element 4.

Furthermore, a dam 6 is provided on the main surface of the wiring board 1 so as to surround a mounting part of the semiconductor element 4. Because of the dam 6, the flow of the underfill material 5 is dammed and a providing area of the underfill material 5 is formed.

Sloped parts A of the underfill material 5 formed in the periphery of the semiconductor element 4 are called fillets. The fillet mitigates local stress concentration on a connection part of the bonding terminals 2 and the convex (projection) outside connection terminals 3 due to the difference of coefficients of thermal expansion between the wiring board 1 and the semiconductor element 4. As a result of this, reliability of connection between the wiring board 1 and the semiconductor element 4 is improved.

Under this structure, it is possible to block flowing-in of the underfill material 5 by the dam 6 even if a terminal for mounting another electrical component is close to the mounting part of the semiconductor element 4 on the wiring board 1.

In addition, by forming the dam 6 with designated height, the thickness (height) of the underfill material 5 can be controlled to have a designated value.

For example, a structure where a resin flow prevention frame is provided is suggested in Japanese Laid-Open Patent Application Publication No. 8-97535. The resin flow prevention frame surrounds an electronic component housing, amounting part and bonding holes provided on a printed wiring board. The resin flow prevention frame has an inside surface having a zigzag or continuous concave and convex shaped configuration.

A semiconductor device having a mounting substrate where an electrode pad is formed around a rectangular chip mounting region and a dam is provided between the chip mounting region and the electrode pad; a semiconductor chip flip-chip mounted on the chip mounting region of the mounting substrate; and an underfill material filling in between the mounting substrate and the semiconductor chip, is suggested in Japanese Laid-Open Patent Application Publication No. 2005-276879. In the semiconductor device, the distance between the predetermined side of the chip mounting region onto which the underfill material is dropped upon the manufacturing of the semiconductor device and the dam corresponding to the side is longer than the distance between another side of the chip mounting region and the dam corresponding to the other side.

A wiring board where an underfill material is provided for mounting an electronic component is suggested in Japanese Laid-Open Patent Application Publication No. 2006-140327. The wiring board has a solder land and a dam land. The solder land is connected to an outside connection terminal of the electronic component via solder. The dam land is provided in the periphery of a mounting area of the electronic component and is based for forming the solder dam. The electronic component can be mounted even outside of the solder dam.

A printed wiring board having the following structure is suggested in Japanese Laid-Open Patent Application Publication No. 2005-175113. This printed wiring board has a board body in which an IC chip is mounted and a board conductor connected to an electrode of the IC chip is formed, and an insulating passivation film which is formed on the board body and has an opening at a mounting position of the IC chip. The distance between each side of the external shape of the IC chip and the opening edge of the insulating passivation film is 0.2 to 0.5 mm. Further, the corner of the opening is locally widely perforated.

However, the above-discussed related art structure where a dam configured to block the flow of the underfill material and having a size larger than the semiconductor element surrounds the mounting area of the semiconductor element on the upper surface of the wiring board has the following problems.

The problems of the related art structure where the dam is provided on the upper surface of the wiring board so as to surround the mounting area of the semiconductor element are discussed with reference to FIG. 2 through FIG. 4. In FIG. 2 and FIG. 3, illustration of outside connection terminals selectively provided on a rear surface of the wiring board is omitted.

In the semiconductor device 10 shown in FIG. 1, if the underfill material 5 is cured by heating, the underfill material 5 shrinks upon being cured.

The underfill material 5 and the wiring board 1 which is an organic board, have coefficients of thermal expansion greater than that of the semiconductor element 4. Accordingly, if the underfill material is cured by heating and the temperature returns to the room temperature after curing is completed, the underfill material 5 and the wiring board 1 shrink greater than the shrinkage of the semiconductor element 4 while each structural member has a small internal stress.

As a result of this, as shown in FIG. 2, a curve is generated where a semiconductor element 4 side is concave. At this time, the internal stress of each structural member becomes greater.

If a temperature cycle test (drastic temperature change) and/or a moisture absorption reflow test (heating after moisture is absorbed in a high temperature humidistat environment) are/is applied to the curved semiconductor device 10, delamination may be generated at an interface (a part indicated by arrows in FIG. 2) between the fillet part of the underfill material 5 positioned in the periphery of the semiconductor element 4 and the dam 6.

Such delamination expands from a part where the delamination is generated as a starting point. As a result of this, moisture may enter inside the semiconductor device via the part where delamination is generated. Due to entry of the moisture, corrosion and/or breakage may occur at a wiring inside the semiconductor device 10 and/or the convex outside connection terminal 3.

The above-discussed problem is more serious when the number of the structural members is increased so that the mechanical structure is complex. For example, when a large sized semiconductor element having a large number of terminals is flip-chip mounted and/or when an outside connection terminal is provided in the periphery of the semiconductor element mounted on the wiring board so that a stacked type semiconductor device such as an SiP (System in Package) type semiconductor device is formed, the above-discussed problem is more serious.

In addition, in order to correspond to demand for high density mounting of the semiconductor devices in the electronic apparatus, miniaturization of the semiconductor devices is attempted.

On the other hand, the underfill material 5 protects the circuit forming surface of the semiconductor element 4 and the convex outside connection terminals 3 and reinforces the connection between the wiring board 1 and the semiconductor element 4 so that the connection reliability of the wiring board 1 and the semiconductor element 4 is secured and improved. More specifically, an area where the wiring board 1 and the fillet A of the underfill material 5 come in contact with each other, namely the sloped expanding area in the periphery of the semiconductor element 4, influences on the connection reliability between the wiring board 1 and the semiconductor element 4. See FIG. 3(a).

Therefore, if an inside wall side surface of the dam is positioned close to the semiconductor element 4 in order to miniaturize the semiconductor device 10, expansion of the fillet A is small so that the connection reliability between the wiring board 1 and the semiconductor element 4 may not be realized.

On the other hand, in order to miniaturize the semiconductor device 10, as shown in FIG. 3(b), the width of the dam 6 may be shortened without changing the size of the fillet A.

However, according to the structure shown in FIG. 3(b), when the width of the dam 6' is less than the height of the dam 6', the stress is concentrated at the interface (a surface indicated by an arrow in FIG. 3(b)) of the dam 6' and the surface of the wiring board 1, so that delamination of the dam 6' at the interface or crack at the dam 6' and/or the wiring board 1 may be generated.

If such delamination or crack is generated, moisture may enter from the generation part to inside the semiconductor device. As a result of this, corrosion and/or breakage may happen at a wiring inside the semiconductor device 10' and/or the convex outside connection terminal 3 so that desirable reliability cannot be obtained. In addition, depending on the material forming the dam 6', collapse of the dam 6' may happen.

On the other hand, the structure discussed in the above-mentioned Japanese Laid-Open Patent Application Publication No. 2005-175113, that is a structure where the fillet may be made large by providing the dam far from the semiconductor element at four corners where the stress may be concentrated, is effective from the view point of improving the reliability of the connection. However, such a structure does not consider the miniaturization of the semiconductor device.

On the other hand, as an example of the high density mounting of the semiconductor device, a POP (Package On Package) type semiconductor device where plural semiconductor devices are stacked is suggested.

As shown in FIG. 4, in the POP type semiconductor device, a semiconductor device 20 is mounted on the semiconductor device 10. In the semiconductor device 10, the semiconductor element 4 is flip-chip mounted on the wiring board 1. The semiconductor device 20, comparing a semiconductor element 9 mounted on an upper surface of a wiring board 8, is connected to the semiconductor device 10 via outside connection terminals 13. The wiring board 8 and the semiconductor element 9 are connected to each other by bonding wires 11.

Under this structure, in the semiconductor device 20, the upper surface of the wiring board 8 including the semiconductor element 9 and the bonding wires 11 are sealed by sealing resin 12. On the other hand, the outside connection terminals 13 such as spherical electrode terminals provided on surfaces of electrodes selectively formed are provided at parts corresponding to the outside connection terminals 7 of the semiconductor device 10 of the lower surface of the wiring board 8.

The outside connection terminals 13 of the semiconductor device 20 are connected to the outside connection terminals 7 of the semiconductor device 10 so that the semiconductor device 20 is stacked on the semiconductor device 10. In addition, outside connection terminals 14 such as spherical electrode terminals provided on surfaces of electrodes selectively formed are provided on the rear surface of the wiring board 1 of the semiconductor device 10.

Under this structure, when the temperature is changed, due to the difference of coefficients of thermal expansion among the structural members, as shown in FIG. 4, a curve is formed in the semiconductor device 10 so that the semiconductor element 4 side is convex. On the other hand, in the semiconductor device 20, a curve is formed so that the wiring board side 8 is concave.

As a result of this, the internal stress in each structural member becomes great so that delamination at the interface of the dam 6 and the fillet part of the underfill material 5 positioned in the periphery of the semiconductor element 4 may be generated.

Even in such a POP type semiconductor device, miniaturization of the size is in high demand as is providing the outside connection terminals 7 close to the semiconductor element 4. In addition, in the structure shown in FIG. 4, in a case where a capacitive element or the like is connected to the outside connection terminal 7 of the wiring board instead of a case where the semiconductor device 20 is mounted on the semiconductor device 10, there is demand to provide the outside connection terminals 7 close to the semiconductor element 4 so that electric properties of the semiconductor device 10 are improved.

In this case, it is necessary to arrange the dam 6 provided between the outside connection terminals 7 and the semiconductor element 4 close to the semiconductor element 4 on the wiring board 1. Therefore, sufficient expansion of the fillet A cannot be obtained and thereby the reliability of connection of the wiring board 1 and the semiconductor element 4 may be degraded.

If the size of the fillet A is maintained by reducing the width of the dam 6, the stress may be concentrated at the interface of the dam 6 and the surface of the wiring board 1. Therefore, the delamination of the dam 6 at the interface or a crack at the dam 6 and/or the wiring board 1 may be generated in the vicinity of the interface.

SUMMARY OF THE INVENTION

According to one aspect of the present invention, a wiring board where an electronic component is mounted on a main surface via a bump and at least a part of the periphery of the electronic component is covered with resin, the wiring board including: a dam provided at least at a part of the periphery of an area where the electronic component is mounted, on the main surface of the wiring board; wherein a surface of the dam contacting the resin has a configuration where a curved line is continuously formed, is provided.

According to another aspect of the embodiment, a semiconductor device, including a wiring board; and a semiconductor element mounted on a main surface of the wiring board via a bump; wherein a dam is provided at least at a part of the periphery of the semiconductor element on a main surface of the wiring board; and the dam has a configuration where a curved line is continuously formed; and resin is formed on a surface of the wiring board between the semiconductor element and the dam, is provided.

DETAILED DESCRIPTION OF THE PREFERRED EMBODIMENTS

A description is given below, with reference to FIG. 5 through FIG. 19 of embodiments of the present invention.

In the following embodiments of the present invention, semiconductor elements to be mounted on wiring boards are discussed as examples of electronic components to be mounted on the wiring boards. However, the present invention is not limited to these examples. The present invention can be applied other electronic components mounted on wiring boards by bump connecting methods, such as a BGA (Ball Grid Array) type semiconductor device or an LGA (Land Grid Array) type semiconductor device.

First Embodiment of the Present Invention

Figure 1:
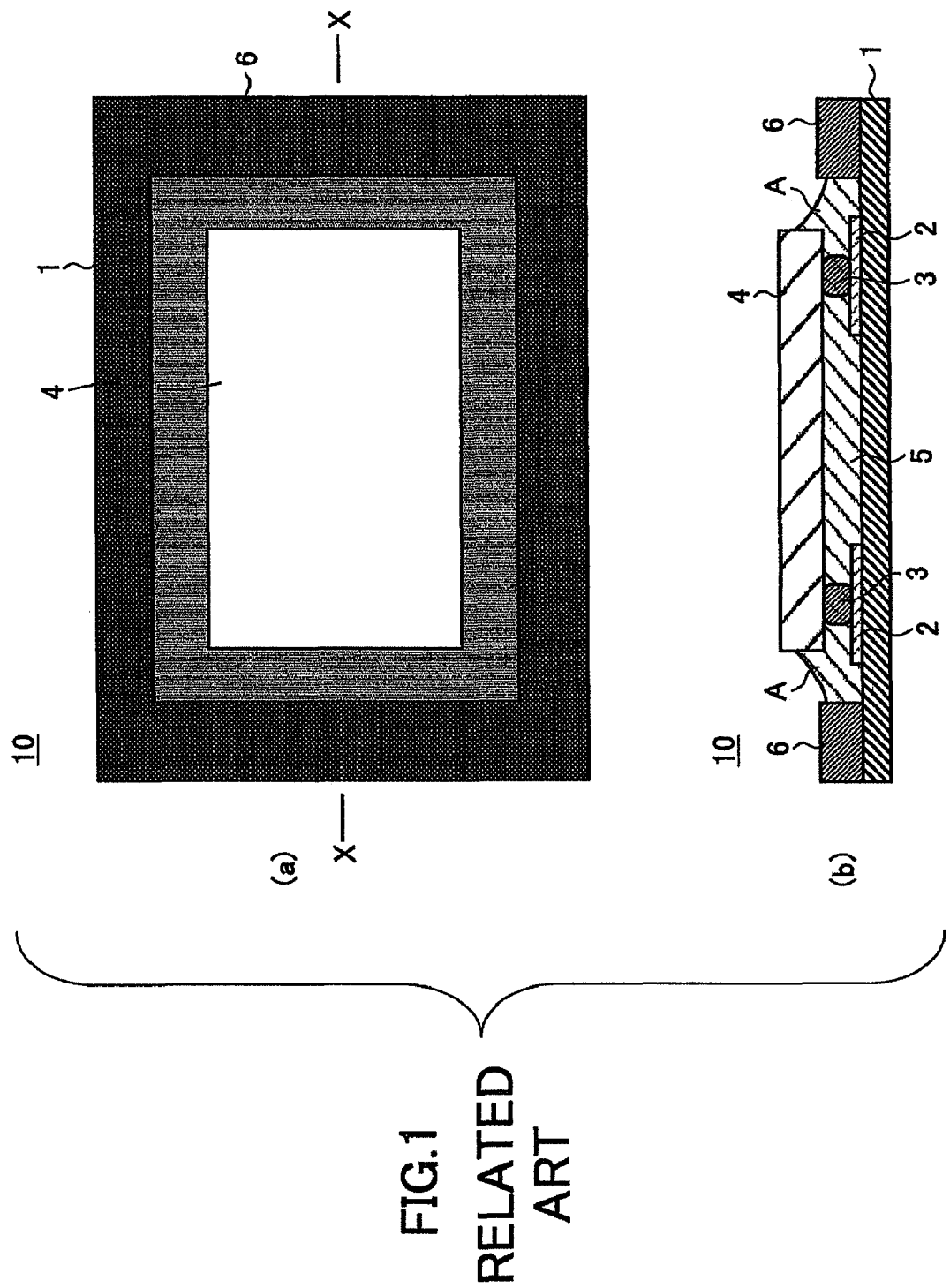
FIG. 1(a) is a plan view and FIG. 1(b) is a cross-sectional view showing a related art semiconductor device where a semiconductor element is flip-chip mounted on a wiring board where a dam is provided.
Figure 2:
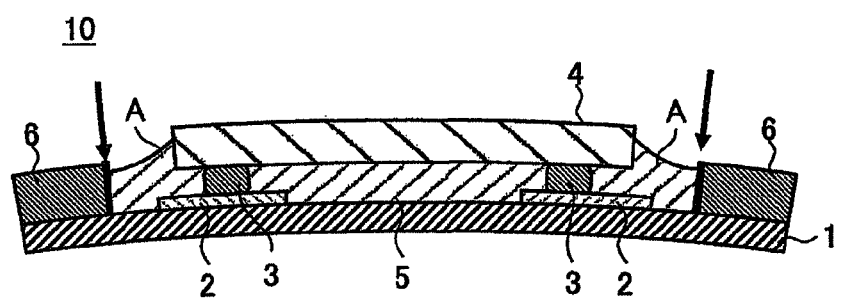
FIG. 2 is a first cross-sectional view showing problems of a dam structure surrounding a mounting area of the semiconductor device.
Figure 3:
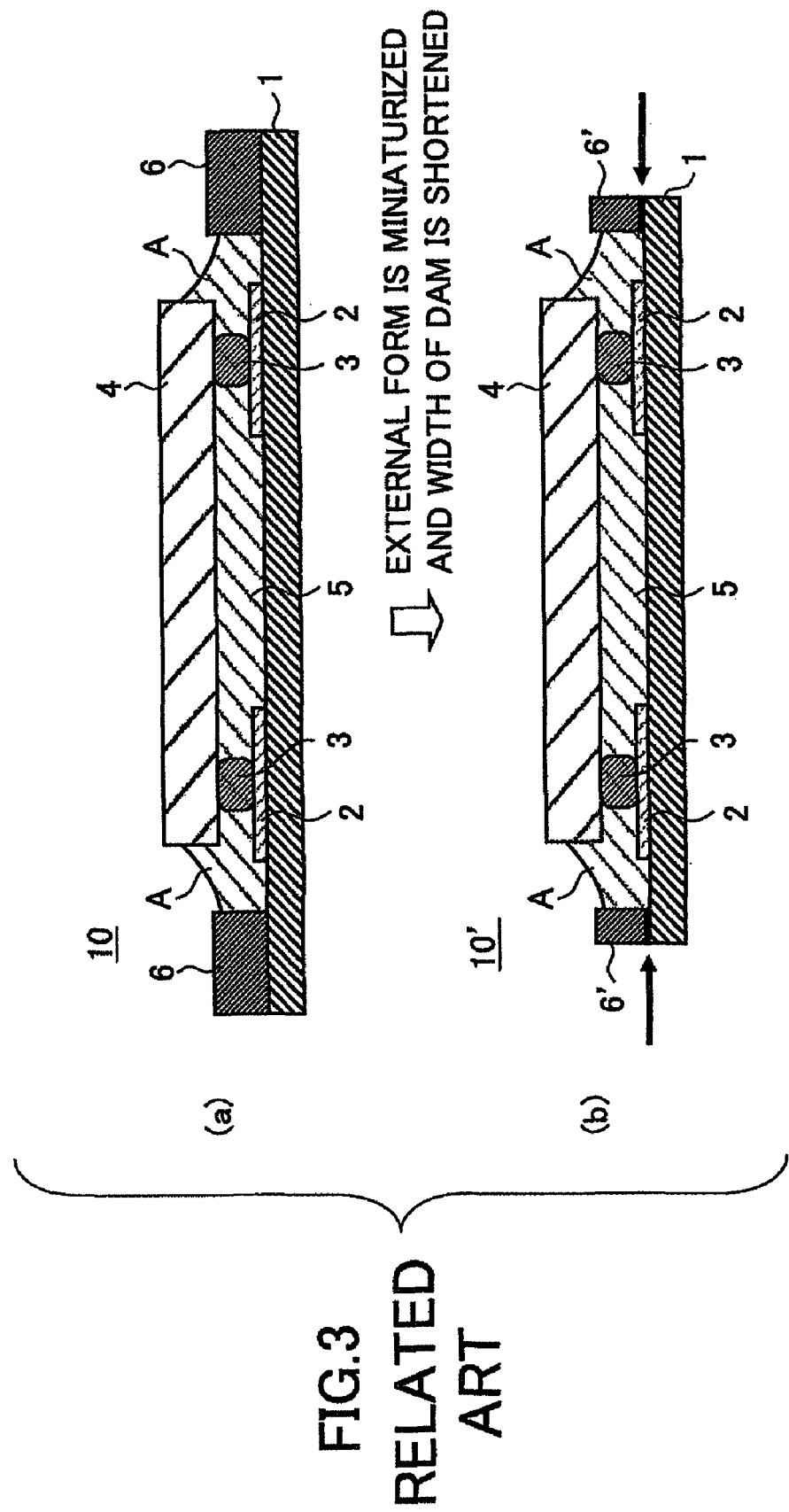
FIG. 3 is a second cross-sectional view showing problems of a dam structure surrounding a mounting area of the semiconductor device.
Figure 4:
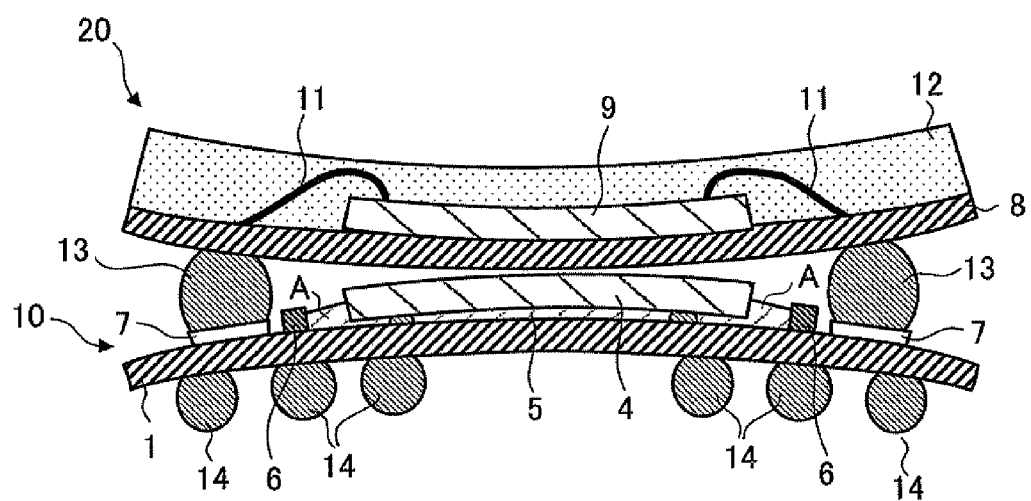
FIG. 4 is a third cross-sectional view showing problems of a dam structure surrounding a mounting area of the semiconductor device.
Figure 5:
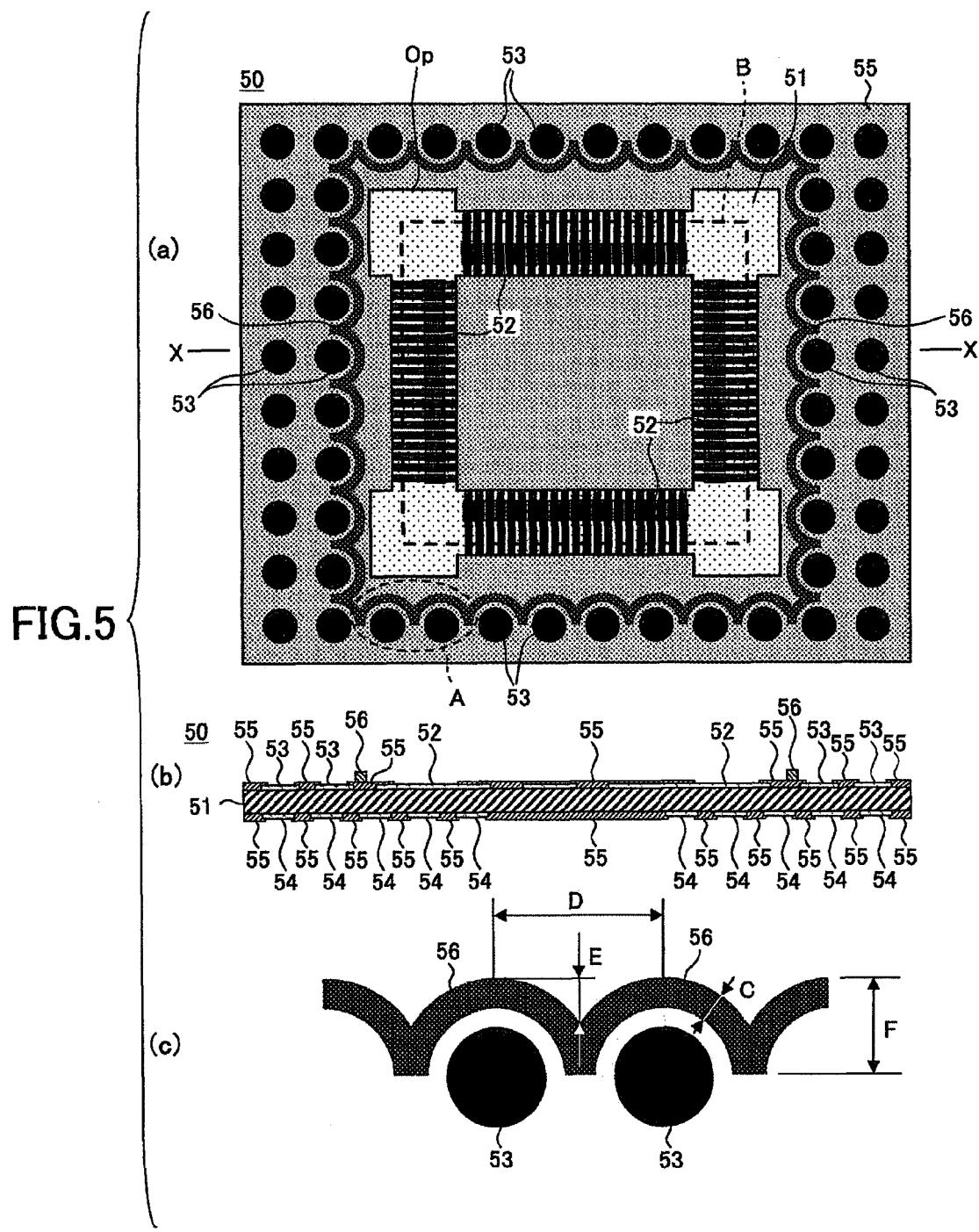
FIG. 5(a) is a plan view and FIG. 5(b) is a cross-sectional view showing a structure of a wiring board of a first embodiment of the present invention.
FIG. 5(c) is an expanded plan view of a part indicated by a dotted line A.

A structure of a wiring board of the first embodiment of the present invention is shown in FIG. 5. FIG. 5(b) shows a cross section taken along a line X-X of FIG. 5(a). FIG. 5(c) is an expanded view of a part indicated by a dotted line A. A rectangular area surrounded by a dotted line B in FIG. 5(a) indicates a mounting area of a semiconductor element.

Referring to FIG. 5(a) and FIG. 5(b), in a wiring board 50 of the first embodiment of the present invention, wiring patterns are selectively provided on both surfaces of a substrate base 51 so that a multilayer structure is formed. The substrate base 51 is made of an organic resin material such as glass-epoxy, glass-BT (bismaleimide-triazine), or polyimide, an inorganic material such as ceramic or glass, or a semiconductor material such as silicon (Si). The wiring pattern is made of copper (Cu), aluminum (Al), or the like.

Electrode terminals 52 and outside connection terminals 53, as a part of the wiring patterns, are provided on a main surface (upper surface) of the substrate base 51. An electrode of a semiconductor element flip-chip mounted on the wiring board 50 is connected to the electrode terminals 52. A semiconductor device (hereinafter "upper semiconductor device") stacked on the wiring board 50 is connected to the outside connection terminals 53.

In addition, plural outside connection terminals 54 are provided on another main surface (rear surface) of the substrate base 51. Spherical shape electrode terminals are provided on the outside connection terminals 54 so that the wiring board 50 is connected to a mother board of an electronic apparatus.

The wiring patterns, electrode terminals 52, and the outside connection terminals 53 and 54 are formed by a photo-etching method, selective etching method, or the like.

A double-layer plating layer formed by nickel (Ni)/gold (Au) or a triple-layer plating layer formed by copper (Cu)/nickel (Ni)/gold (Au) from the bottom may be formed on surfaces of the electrode terminals 52 and the outside connection terminals 53 and 54, by an electrolytic plating method or an electroless plating method. It should be noted that illustration of internal layer wiring in the multi-layer wiring structure is omitted.

A remeltable conductive material made of solder, conductive resin or the like may be formed on the surface of the electrode terminals 52.

An insulating resin layer 55 is provided on an uppermost layer of the multilayer wiring structure of the wiring board 50. For example, the insulating resin layer is made of epoxy resin, acrylic resin, polyimide resin, or a mixture of these resin.

The insulating resin layer 55 is formed of, for example, a photosensitive resist material on the surface of the wiring board 50 by a printing method, a spray coating method, a laminating method using a thermal roll, a spin coat method, or the like. An opening pattern is formed by using a photolithography method, a screen printing method, or the like. As a result of this, the electrode terminals 52 are exposed in an opening Op (see FIG. 5(a)) formed in the substantially center part of the upper surface of the wiring board 50. In addition, the outside connection terminals 53 for connecting the semiconductor device are exposed in the vicinity of the external periphery edge part of the upper surface of the wiring board 50. Furthermore, the outside connection terminals 54 are exposed on the rear surface of the wiring board 50.

The insulating resin layer 55 has a thickness of, for example, 1 μm through 30 μm. If greater thickness is required for the insulating resin layer 55, plural resin layers each having thickness of, for example, 1 μm through 15 μm are stacked so that the insulating resin layer 55 is formed.

In the wiring board 50 of the first embodiment of the present invention, a dam 56 is selectively formed in an area between the outside connection terminals 53 and a semiconductor element mounting area indicated by a dotted line B on the upper surface of the wiring board 50. The dam 56 is provided on the insulating resin layer 55 in a ring shape so as to surround the semiconductor element mounting area indicated by the dotted line B, thereby providing an area for an underfill material.

In the wiring board 50 of the first embodiment of the present invention, a configuration or pattern of the ring shaped dam 56 is specific. In other words, an inside surface of the dam 56 coming in contact with the underfill material (a surface at a side of the semiconductor element 56 mounting area indicated by the dotted line B) corresponds to the external configuration (substantially arc shaped configuration) of the outside connection terminals 53 provided on the wiring board 50. The inside surface of the dam 56 has a configuration where the arc shaped curve part continues.

A connection part of the arc curved parts of the dam 56 is provided between neighboring outside connection terminals 53 so as to be toward the outside from the semiconductor element mounting area.

The dam 56 is made of insulating resin such as solder resist, metal such as copper (Cu), aluminum (Al), nickel (Ni), tin (Sn) or alloy of these metals, or an inorganic material such as ceramic. In a case where the dam 56 is made of the insulating resin, the dam 56 can be formed by the same method as a method for forming the insulating resin layer in a manufacturing method of the wiring board so that the dam 56 has good adhesion with the underfill material made of resin. The dam 56 may be made of the same material as the resin material forming the insulating resin layer 55.

In a case where the dam 56 is made of the solder resist material, the height (length from the surface of the wiring board 50 in a perpendicular direction) may be, for example, approximately 10 μm through 300 μm. The width C of the dam 56 may be equal to or greater than approximately 0.1 mm. In addition, the distance D between tops of the neighboring arc curved parts of the dam 56 may be equal to or greater than approximately 0.1 mm and equal to or less than approximately 3 mm. In addition, at the internal wall surface of the dam 56 (a surface of the semiconductor element mounting area indicated by the dotted line B in FIG. 5(a)), the distance E between the top part and the bottom part at the semiconductor element mounting area side of the arc curved part of the dam 56 may be equal to or greater than approximately 0.1 mm and equal to or less than approximately 3 mm. The distance (effective width) F between the top part of the arc curved part and a head end of the connection part of the arc curved parts may be equal to or greater than approximately 0.3 mm.

Next, a structure where the semiconductor element is flip chip mounted (mounted in a face-down manner) on the above-discussed wiring board 50 is discussed with reference to FIG. 6.

FIG. 6(b) shows a cross section taken along a line X-X of FIG. 6(a).

Figure 6:
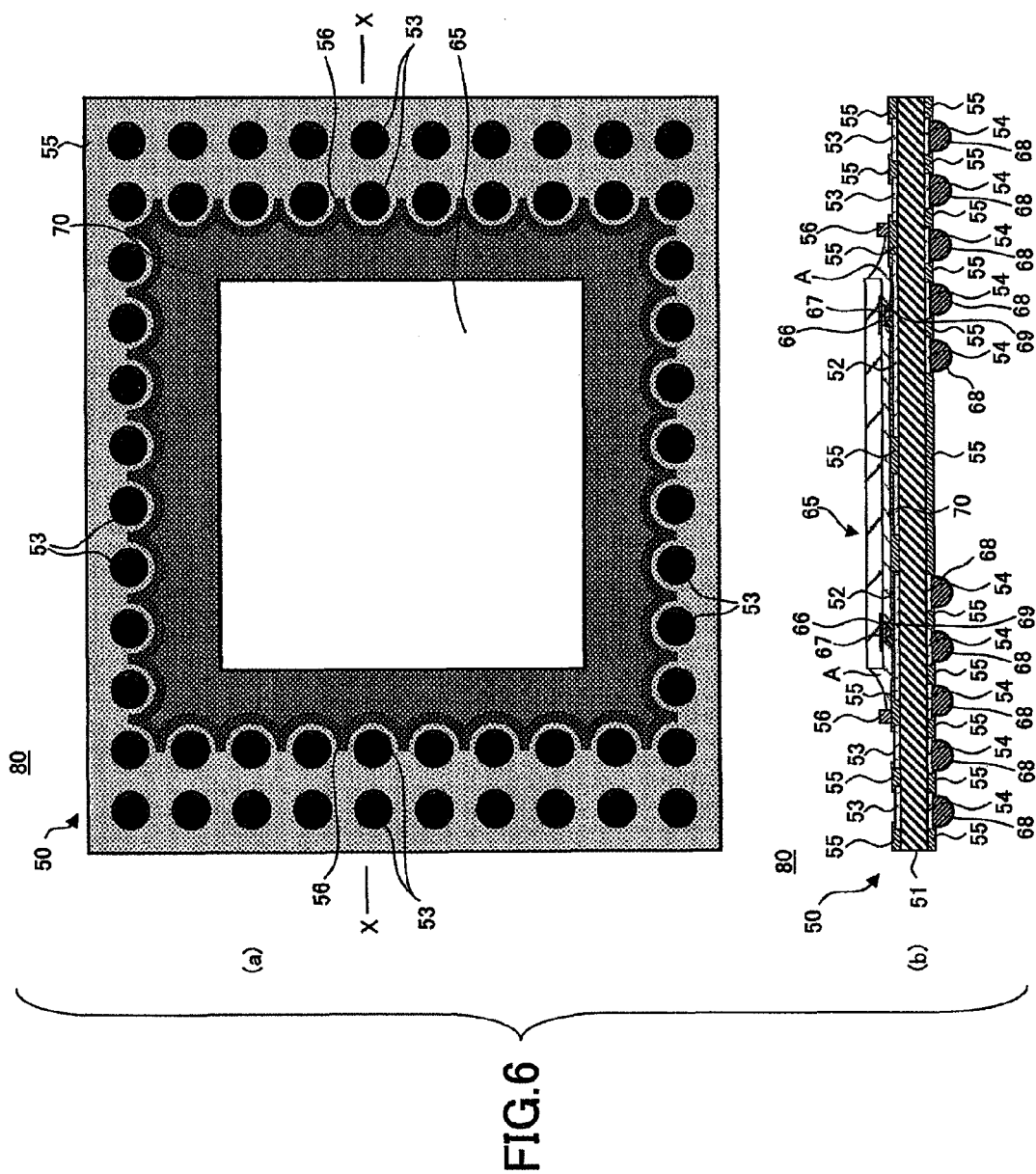
FIG. 6(a) is a plan view and FIG. 6(b) is a cross-sectional view showing a structure where a semiconductor element is flip-chip mounted on the wiring board shown in FIG. 5.

Referring to FIG. 6, a semiconductor element 65 is mounted in the semiconductor element mounting area indicated by the dotted line B in FIG. 5(a) on the upper surface of the wiring board 50 in a face-down manner.

The semiconductor element 65 is formed by applying a wafer process. The semiconductor element 65 has an electronic circuit formed by an active element such as a transistor, a passive element such as a capacitor, and a wiring layer connected to these elements. Electrode pads 66 are formed on a main surface of a semiconductor substrate made of silicon (Si) or gallium arsenide (GaAs) of the semiconductor element 65. The electrode pads 66 are made of metal having aluminum (Al) or copper (Cu) as a main body.

Bumps 67 acting as convex outside connection terminals are formed on the electrode pads 66. The bumps 67 are made of gold (Au), copper (Cu), an alloy of these metals, or solder.

In FIG. 6, illustrations of the circuit element and the wiring layer of the semiconductor element 65 are omitted.

On the other hand, a remeltable conductive member 69 such as solder or conductive resin is formed on the surface of the electrode terminal 52 provided on the surface of the wiring board 50 so as to correspond to the electrodes of the semiconductor element 65. The conductive members 69 are formed by a printing method, transferring method, evaporation method, or chemical reaction depositing method, or the like. The electrode terminals 52 of the wiring board 50 and the bumps 67 of the semiconductor element 65 are connected to each other via the conductive member 69.

Spherical shape electrode terminals 68 are provided on the outside connection terminals 54 provided on the rear surface of the wiring board 50.

An underfill material 70 is provided in a space where the wiring board 50 and the electronic circuit forming surface of the semiconductor element 65 face each other and an area between the external periphery part of the semiconductor element 65 and the dam 56.

The space where the wiring board 50 and the electronic circuit forming surface of the semiconductor element 65 face each other and the area between the external periphery part of the semiconductor element 65 and the dam 56 are sealed by the underfill material 70, so that the semiconductor element 65 is fixed to the wiring board 50.

The underfill material 70 has a part A formed in a slope shape and called a fillet. The part A is situated between the periphery of the semiconductor element 65 and the dam 56.

The underfill material 70 is a thermosetting adhesive such as epoxy resin, polyimide resin or acrylic resin and may contain inorganic filler such as silica or ceramics so that the coefficient of thermal expansion, viscosity, or flowability of the cured resin can be controlled. In addition, the underfill material 70, depending on the method for flip-chip mounting, may contain conductive filler such as silver (Ag) particles or plastic particles whose surface is covered with a metal.

As discussed above, the dam 56 is provided between the semiconductor element 65 mounting area and plural outside connection terminals 53 provided in a grid, on the wiring board 50 where the semiconductor element 65 is flip-chip mounted.

It is possible to prevent the underfill material 70 from flowing out and reaching the outside connection terminals 53 by providing the dam 56. Therefore, it is possible to provide the outside connection terminals 53 close to the semiconductor element 65 mounting parts. Hence, it is possible to miniaturize the semiconductor device and improve the degree of the design freedom for the wiring board 50.

In particular, in the first embodiment of the present invention, as discussed above, the dam 56 has a configuration where the arc curved parts continue and the connection part of the arc curved parts are positioned between neighboring outside connection terminals 53.

Accordingly, the distance between the dam 56 and the outside connection terminals 53 is not large and miniaturization of the semiconductor device is not obstructed.

In addition, the dam 56 has a configuration where the arc curved parts continue. Therefore, an area where the internal wall surface (a surface at a side of the semiconductor element mounting area indicated by the dotted line B in FIG. 5(a)) of the dam 56 and the underfill material 70 come in contact with each other is large. Furthermore, because of an anchor effect due to this configuration, the adhesive properties of the underfill material 70 are increased. Therefore, it is possible to improve the adhesion between the underfill material 70 and the dam 56.

In addition, the dam 56 has a configuration in plan view where the arc curved parts continue. Accordingly, the effective width (measurement of part F shown in FIG. 5(c)) of the dam is greater than the width (measurement of part C shown in FIG. 5(c)) of the dam, and therefore it is possible to reduce stress concentration in the vicinity of the interface between the dam 56 and the wiring board 50. Because of this, it is possible to prevent generation of the delamination of the dam 56 at the interface or crack at the dam 56 and/or the wiring board 50.

Accordingly, it is possible to prevent generation of delamination at the interface between the fillet A of the underfill material 70 and the dam 56, so that the reliability of the semiconductor device can be improved.

The internal wall surface (the surface situated at the side of the semiconductor element 65 mounting area indicated by the dotted line B in FIG. 5(a)) has a configuration in plan view where the arc curved parts continue. In addition, between the neighboring outside connection terminals 53, the dam 56 is toward the outside from the semiconductor element 65 mounting area indicated by the dotted line B in FIG. 5(a)).

Because of this, the area coming in contact with the wiring board 50 of the fillet A of the underfill material 70, namely a skirt shaped extending area of the underfill material 70 in the periphery of the semiconductor element 65, can be made large. Accordingly, it is possible to improve the adhesiveness between the wiring board 50 and the underfill material 70. Hence, it is possible to improve the reliability of the semiconductor device.

Furthermore, since the arc curved shape part of the dam 56 corresponds to the external configuration (substantially spherical configuration) of the outside connection terminals 53, it is possible to provide the outside connection terminals 53 close to the semiconductor element 65. Hence, it is possible to miniaturize the semiconductor device.

In addition, the dam 56 is provided so as to surround the semiconductor element 65 mounting area indicated by the dotted line B in FIG. 5(a). Accordingly, it is possible to prevent, by the dam 56, the underfill material 70 from flowing and coming in contact with the outside connection terminals 53 along the external periphery of the semiconductor element 65.

Accordingly, it is possible to provide the outside connection terminals 53 close to the semiconductor element 65 mounted on the wiring board 50. Accordingly, it is possible to miniaturize the semiconductor device and improve the degree of design freedom of the wiring board 50.

In particular, the ring-shaped configuration of the dam 56 in this example is a substantially rectangular shape.

In the vicinities of the four corners of the rectangular shaped dam 56, the dam 56 is toward the outside from the semiconductor element 65 mounting area indicated by the dotted line B in FIG. 5(a)). Ends of the four corners of the rectangular shaped dam 56 are positioned furthest from the area where the electronic component is mounted on the wiring board.

Generally, in a case where the semiconductor element is flip-chip mounted on the wiring board, the greatest amount of the stress is concentrated on the four corners of the area surrounding the semiconductor element. Accordingly, as shown in this example, in the vicinity of the four corners, the dam 56 is provided so as to be toward the outside from the semiconductor element 65 mounting area indicated by the dotted line B in FIG. 5(*a*)), so that the fillet A of the underfill material 70 at the four corners can be made large. Therefore, it is possible to sufficiently secure the connection strength between the underfill material 70 and the wiring board. Hence, it is possible to improve the reliability of the semiconductor device.

In addition, the dam 56 is provided on the insulating resin layer 55. Therefore, the dam 56 and the insulating resin layer 55 where the bonding electrodes 52 of the wiring board 50 for connecting the semiconductor element 65 is opened can be formed in a body.

Figure 7:
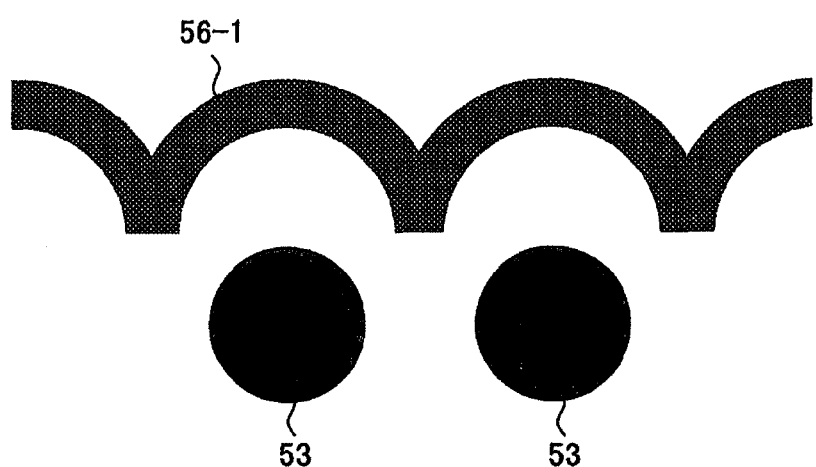
FIG. 7 is a first plan view showing a modified example of the dam shown in FIG. 5.
Figure 8:
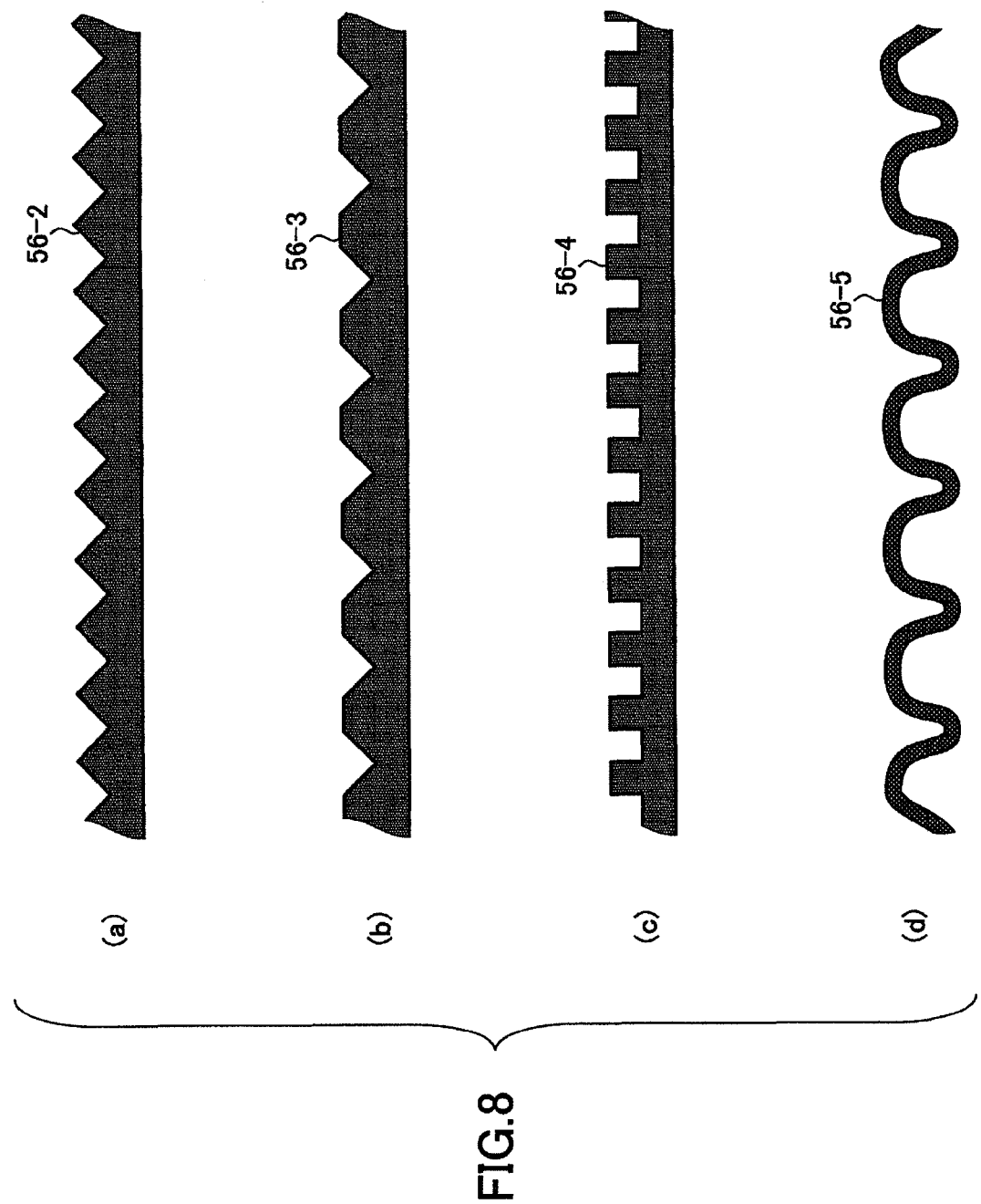
FIG. 8 is a second plan view showing other modified examples of the dam shown in FIG. 5.
Figure 9:
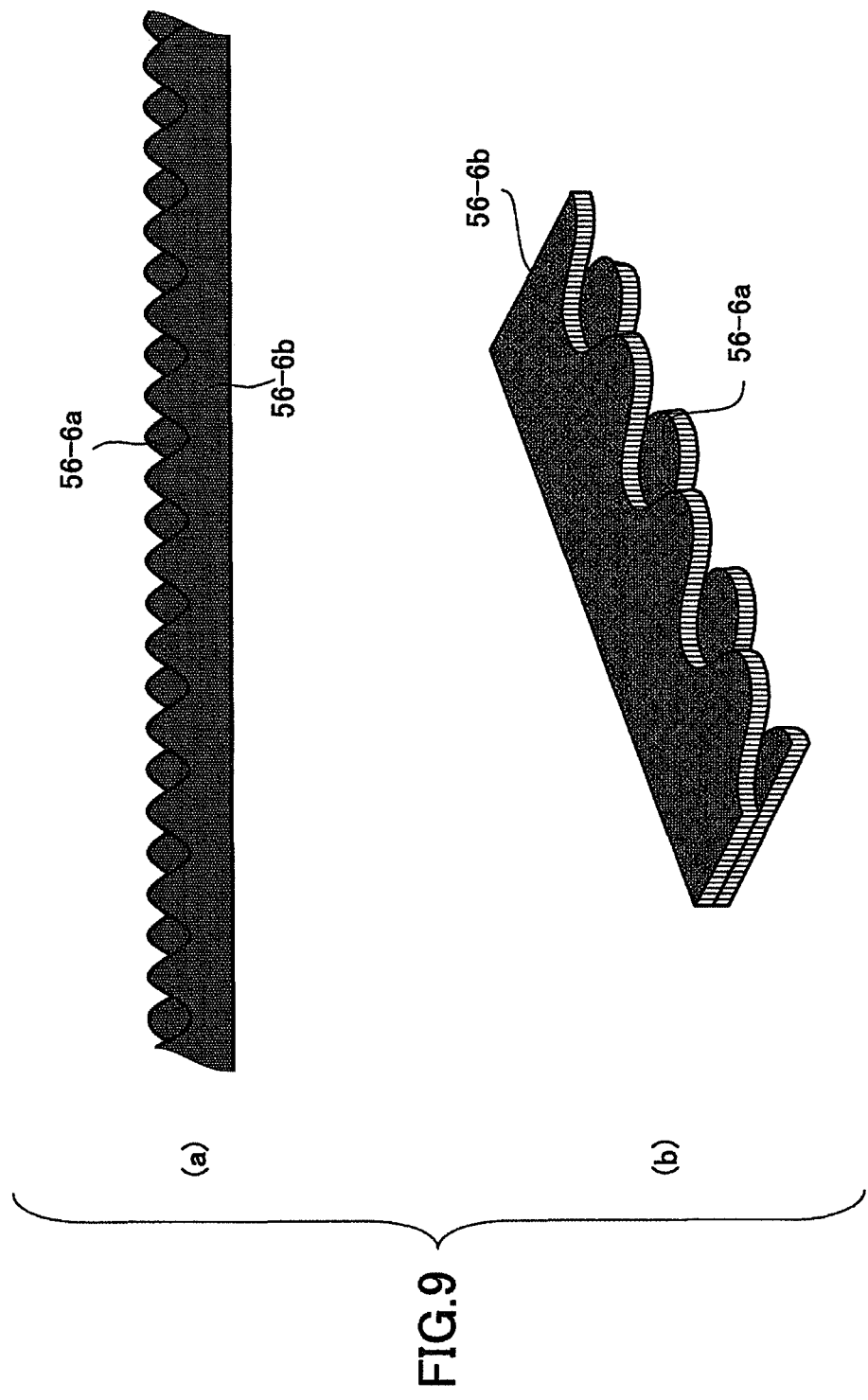
FIG. 9(a) is a third plan view and FIG. 9(b) is a perspective view showing another modified example of the dam shown in FIG. 5.

The dam of the embodiment of the present invention is not limited to the above-discussed example and may have configurations shown in FIG. 7 through FIG. 9. FIG. 9(*b*) is a perspective view of a dam structural body shown in FIG. 9(*a*).

A dam 56-1 which is a first modified example of the dam 56 and the outside connection terminals 53 are shown in FIG. 7.

In this modified example, the dam 56-1 has a configuration in plan view where the arc curved parts continue and is arc toward the outside from the semiconductor element 65 mounting area indicated by the dotted line B in FIG. 5(*a*)). However, the connection part of the arc curved parts is not situated between the outside connection terminals 53.

In the example shown in FIG. 7 as well as the example shown in FIG. 5, the area coming in contact with the wiring board 50 of the fillet A of the underfill material 70, namely a skirt shaped extending area of the underfill material 70 in the periphery of the semiconductor element 65, can be made large. Accordingly, it is possible to improve the adhesiveness between the wiring board 50 and the underfill material 70. Hence, it is possible to improve the reliability of the semiconductor device.

Dams 56-2 through 56-5 which are other examples of the dam 56 are shown in FIG. 8(*a*) through FIG. 8(*d*).

In each drawing, an upper part of the dam 56 corresponds to the semiconductor element 65 mounting area indicated by the dotted line B in FIG. 5(*a*), and a lower part of the dam 56 corresponds to an external periphery side of the wiring board 50.

In other words, the dam 56 may have a plan view of a saw-tooth configuration where acute angles are provided at the semiconductor element 65 mounting area side as shown in FIG. 8(*a*); a plan view of a saw-tooth configuration where shapes of the teeth of saws having acute angles continue with certain gaps as shown in FIG. 8(*b*); a plan view where cuttings having substantially rectangular shaped configurations continue as shown in FIG. 8(*c*); and a plan view where sine waves continue as shown in FIG. 8(*d*).

In addition, the dam 56 may have, as shown in FIG. 9, a double-layer structure formed by a dam 56-6*a* and a dam 56-6*b*.

In the example shown in FIG. 9, at the semiconductor element 65 mounting area side, the dam 56-6*b* is stacked on the dam 56-6*a*. In the dam 56-6*a*, the sine waves in plan view continue. In the dam 56-6*b*, the sine waves in plan view continue with a shift of approximately half pitch of the neighboring wave shape curved parts.

In such a configuration, the number of the sine wave-shaped curved parts is twice the example shown in FIG. 5(*c*). Accordingly, the area where the internal wall surface of the dam 56 and the underfill material 70 come in contact with each other is drastically increased.

In addition, the adhesiveness of the underfill material 70 due to the anchor effect of the plural wave shape curved parts is increased so that the adhesiveness of the underfill material 70 and the dam 56 is improved.

Next, a POP (Package On Package) type semiconductor device where a semiconductor device 90 is stacked on a semiconductor device 80 having the above-discussed structure is discussed with reference to FIG. 10.

Figure 10:
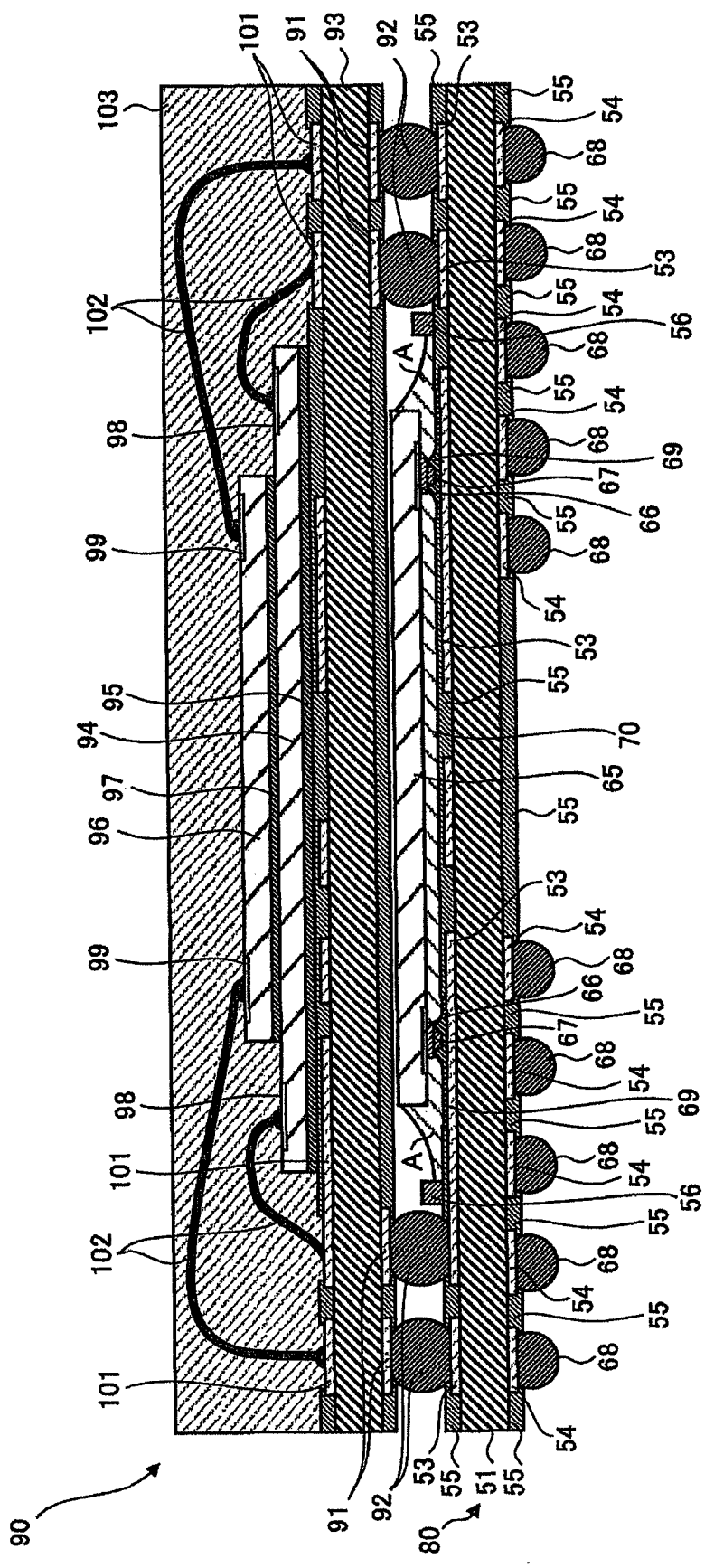
FIG. 10 is a cross-sectional view showing a structure of a POP (Package On Package) type semiconductor device where a semiconductor device is stacked on the semiconductor device shown in FIG. 6.

As shown in FIG. 10, the second BGA (Ball Grid Array) type semiconductor device 90 is stacked on the semiconductor device 80.

In the semiconductor device 90, a first semiconductor element 94 is mounted on a wiring board 93 via a first adhesive 95. In the wiring board 93, spherical shaped electrode terminals 92 whose main bodies are solders are provided on outside connection terminals 91 provided in the vicinities of the external periphery of the rear surface of the wiring board 93.

In addition, a second semiconductor element 96 is mounted on the first semiconductor element 94 via a second adhesive 97.

The first semiconductor element 94 and the second semiconductor element 96 are mounted on the wiring board 93 in a state where electronic circuit forming surfaces of the first semiconductor element 94 and the second semiconductor element 96 face upward.

In addition, electrode pads 98 of the first semiconductor element 94 and bonding pads 101 of the wiring board 93 are connected to each other by bonding wires 102. Electrode pads 99 of the second semiconductor element 96 and the bonding pads 101 of the wiring board 93 are connected to each other by the bonding wires 102.

The first semiconductor element 94, the second semiconductor element 96, and the bonding wires 102 are sealed by sealing resin 103 on the wiring board 93.

Such a semiconductor device 90 is stacked on the semiconductor device 80 and the spherical electrode terminals 92 are connected to the outside connection terminals 53 of the semiconductor device 80, so that the POP (Package On Package) type semiconductor device is formed.

Under this structure, even if the temperature is changed so that a curve is generated between the semiconductor device 80 and the semiconductor device 90 and the stress is concentrated in the vicinity of the spherical electrode terminals 92 of the semiconductor device 90, delamination at the interface of the dam 56 and the fillet A of the underfill material 70 positioned in the periphery of the semiconductor element 65 is not generated because the dam 56 is provided on the semiconductor device 80.

In addition, it is possible to prevent generation of the delamination of the dam 56 at the interface of the dam 56 and a part where the dam 56 is provided, and generation of a crack at the dam 56 in the vicinity of the interface and/or the wiring board 50.

Next, a method for mounting the semiconductor element 65 on the wiring board 50 is discussed with reference to FIG. 11 and FIG. 12.

Figure 11:
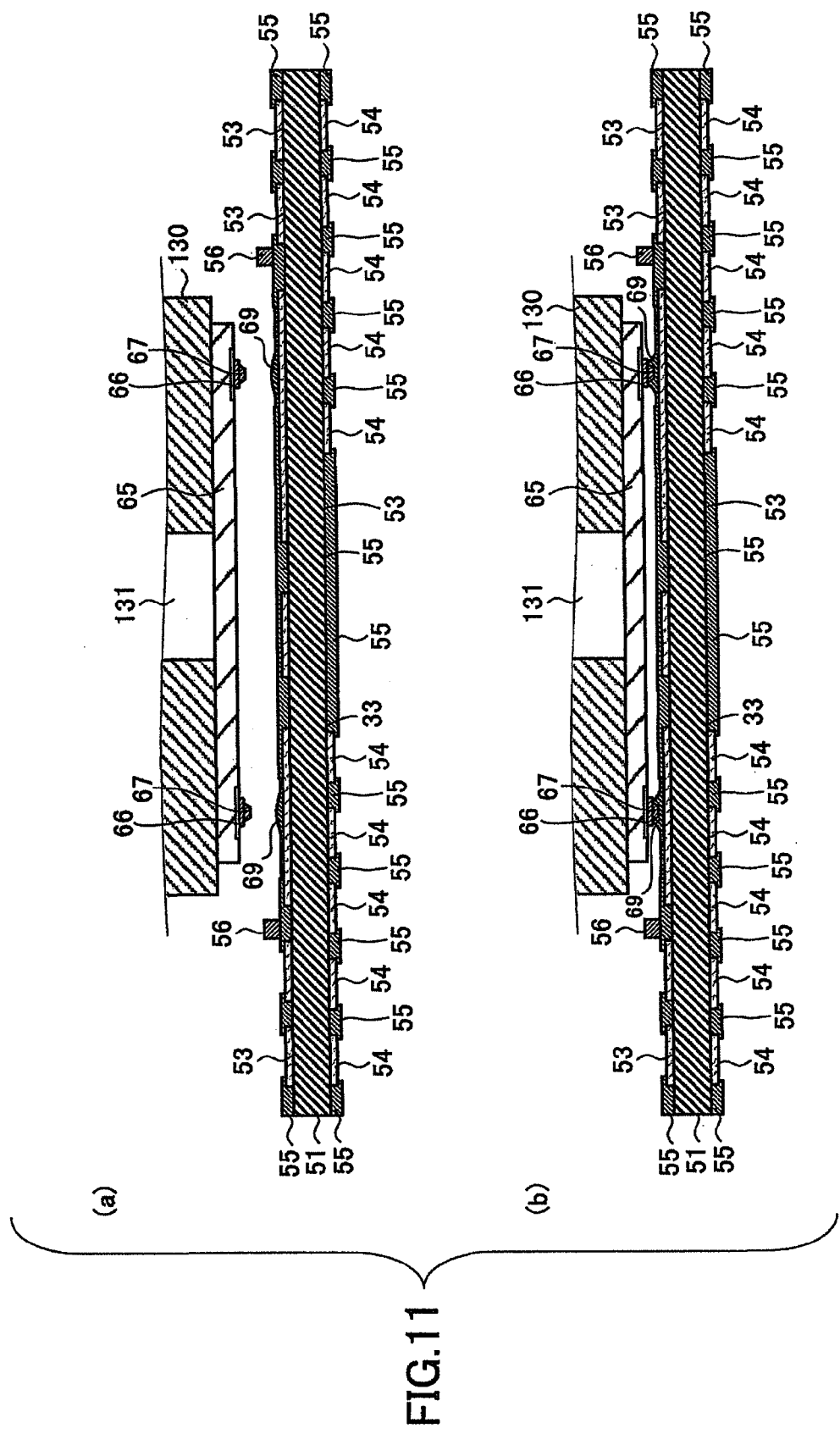
FIG. 11 is a first cross-sectional view showing steps of mounting the semiconductor element on the wiring board shown in FIG. 5.
Figure 12:
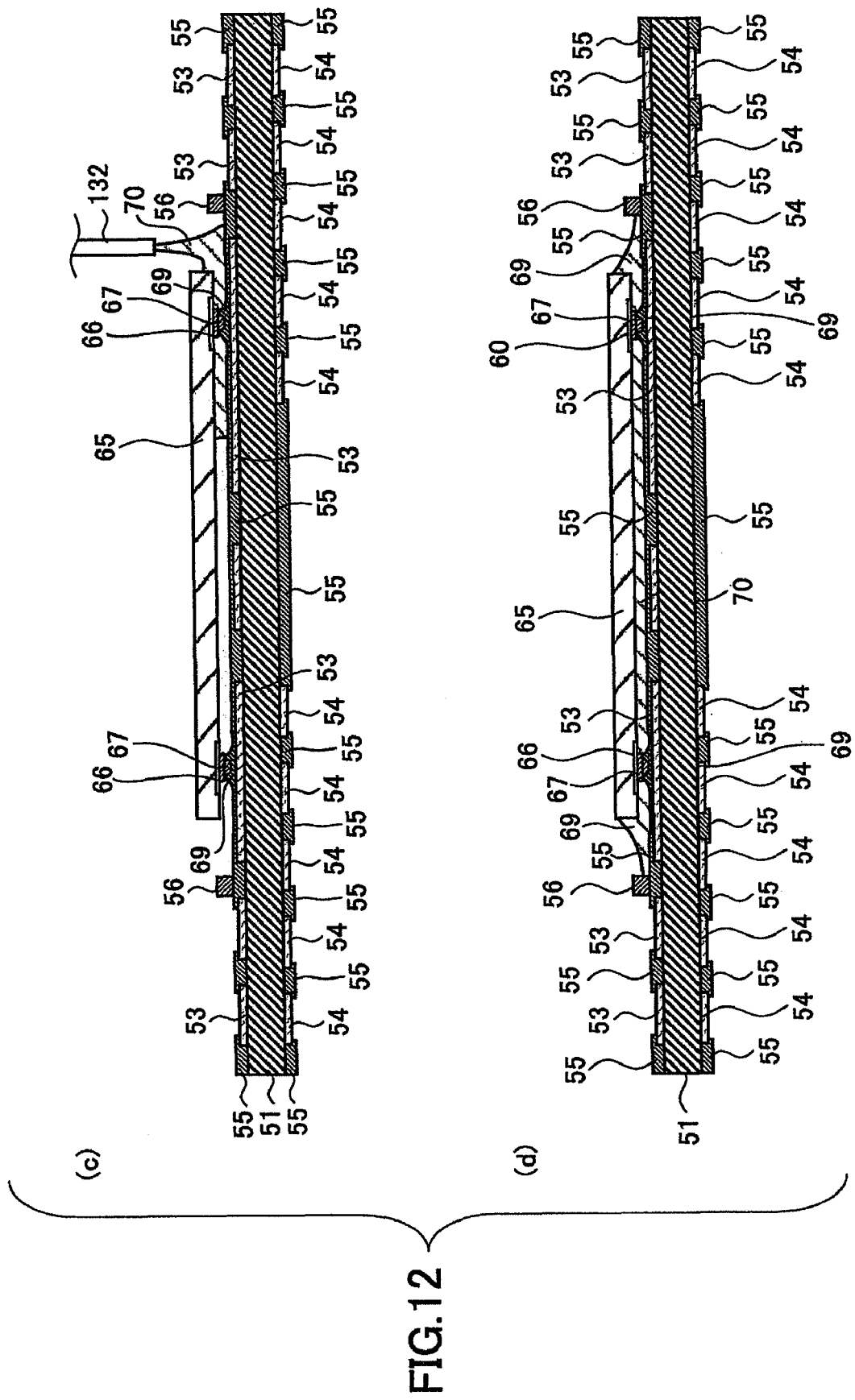
FIG. 12 is a second cross-sectional view showing steps of mounting the semiconductor element on the wiring board shown in FIG. 5.

First, the wiring board 50 is held by suction on a bonding stage (not shown in FIG. 11 and FIG. 12). At this time, the bonding stage may be heated so that the wiring board 50 may be heated at approximately 50° C. through 100° C. See FIG. 11(*a*). The remeltable conductive material 69 such as solder is formed on the surface of the bonding electrode 52 of the wiring board 50 in advance.

The dam 56 is provided between the outside connection terminals 53 and the semiconductor element 65 mounting area indicated by the dotted line B in FIG. 5(a) on the upper surface of the wiring board 50. The dam 56 has a plan view configuration where the arc curved shape parts continue. The dam 56 is formed on and in a body with the insulating resin layer 55 of the same material and by the same manufacturing method as those of the insulating resin layer 55.

In other words, the insulating resin layer 55 and the dam 56 are formed in a body by forming the dam 56 with the same material and same manufacturing method as those of the insulating resin layer 55. Because of this, the adhesiveness of the insulating rein layer 55 and the dam 56 is improved so that the interface stress between the insulating resin layer 55 and the dam 56 can be reduced. Therefore, it is possible to prevent generation of cracks and others at the interface due to stress concentration. Furthermore, it is possible to reduce the number of structural members of the wiring board 50.

The dam 56 can be formed by attaching a frame-shaped, L-shaped, a shape of a rectangle without one side, or stick-shaped plate member to the wiring board 50. The plate member is formed by etching, mechanical processing, casting, punching or the like in advance. A material for the plate member can be selected from metal such as copper (Cu), aluminum (Al), nickel (Ni) or tin (Sn) or an alloy of these metals, an organic material such as epoxy, or an inorganic material such as ceramic.

In addition, the dam 56 may be formed by applying paste resin on the wiring board 50 by a dispensing method and curing the resin.

Furthermore, the dam 56 can be formed by forming a dummy wiring pattern on a dam forming planning part of the wiring board 50 in advance, applying solder paste on the dummy wiring pattern, and reflowing the solder.

On the other hand, the semiconductor element where the bumps 67 are formed on the electrode pads 66 is held by suction on the bonding tool 130 via a suction hole 131. The bonding tool 130 is heated at, for example, approximately 250 through 320° C.

In addition, the bumps 67 can be formed by a ball bonding method using a wire bonding technique. As a forming method of the bumps 67, another method such as a plating method, transferring method, or printing method can be used in addition to the ball bonding method.

Next, the bumps 67 of the semiconductor element 65 and the bonding electrodes 52 of the wiring board 50 are positioned so as to face each other.

Then, the bonding tool 130 suctioning and holding the semiconductor element 65 is lowered so that the bumps 67 of the semiconductor element 65 are pushed to and contact the bonding electrodes 52 of the wiring board 50. As a result of this, the conductive material 69 coated on the surface of the bonding electrode 52 is heated and made molten and thereby the bumps 67 of the semiconductor element 65 and the bonding electrodes 52 of the wiring board 50 are connected to each other. See FIG. 11(b). At this time, as an applying load of the bonding tool 130, for example, a load of approximately 1 gf/bump through 140 gf/bump can be selected.

Next, by using a dispenser (not shown in FIG. 11), the paste underfill material 70 is supplied from the nozzle 132. See FIG. 12(c). In other words, the paste underfill material 70 is supplied from the nozzle 132 to a space between the semiconductor element 65 and the dam 56 so as to be supplied to a space between the semiconductor element 65 and the wiring board 50 and the external periphery part of the semiconductor element 65 due to capillarity action.

When the underfill material 70 is supplied, the wiring board 50 may be heated at a temperature where the underfill material 70 is not started being cured, for example approximately 30° C. through 100° C. As a result of this, the underfill material 70 maintains a high flowing ability so that a time for supplying the underfill material 70 can be shortened. In addition, it is possible to prevent or reduce generation of parts where the underfill material 70 is not supplied, or voids.

Next, the underfill material 70 is heated and cured by using an oven or the like. In this process, the heating temperature can be, for example, approximately 120° C. through 200° C.; and the heating time period can be, for example, approximately 30 minutes through 90 minutes. Because of this, the semiconductor element 65 can be mounted on the wiring board 50. See FIG. 12(d).

After that, plural solder balls forming spherical electrode terminals 68 (see FIG. 6(b)) are provided on the rear surface of the wiring board 50, so that the semiconductor device 80 shown in FIG. 6(b) is formed.

Second Embodiment of the Present Invention

Figure 13:
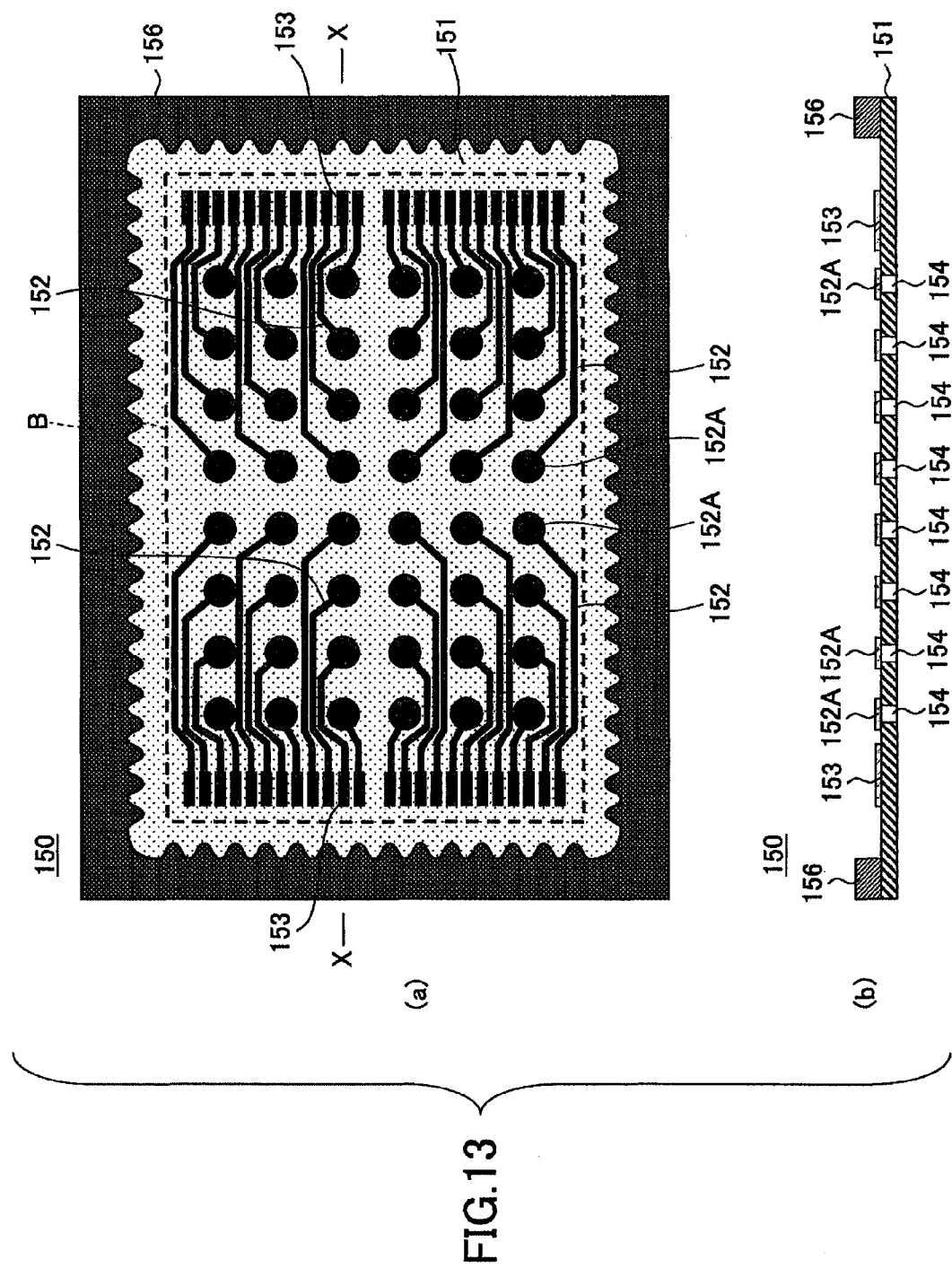
FIG. 13(a) is a plan view and FIG. 13(b) is a cross-sectional view showing a structure of a wiring board of a second embodiment of the present invention.

A structure of a wiring board of the second embodiment of the present invention is shown in FIG. 13. FIG. 13(b) shows a cross section taken along a line X-X of FIG. 13(a). An area surrounded by a dotted line B in FIG. 13(a) indicates a mounting area of a semiconductor element on the wiring board.

Referring to FIG. 13, a wiring board 150 of the second embodiment of the present invention includes a tape board made of an organic resin material such as polyimide. A wiring pattern 152 is formed on only (a main surface) an upper surface of the wiring board 150. Bonding electrodes 153 as parts of the wiring pattern 152 are provided at end parts at an external periphery side of an upper surface of the wiring board 150.

Piercing holes 154 formed in a base 151 are provided at other parts 152A of the wiring patterns 152. Spherical electrode terminals 155 (see FIG. 14) whose main bodies are solder are provided at the piercing holes 154 for connecting the external circuit of a motherboard or the like.

A dam 156 is selectively provided in the vicinity of the external periphery of the upper surface of the wiring board 150. In other words, the dam 156 is provided outside the semiconductor element 65 mounting area indicated by the dotted line B.

The dam 156 is configured to block the flow of the underfill material 70 supplied in a space between the semiconductor element 65 and the wiring board 150 when the semiconductor element 65 is flip-chip mounted on the wiring board 150. The dam 156 surrounds the semiconductor element 65 mounting area indicated by the dotted line B and is provided on the base 151 in a ring shape. Under this structure, the providing area of the underfill material 70 is defined.

The internal wall surface coming in contact with the underfill material 70 (the surface at a side of the semiconductor element 65 mounting area indicated by the dotted line B) of the dam 156 has a configuration in plan view where wave-shaped concavities and convexities continue. The configuration in plan view of the internal wall surface of the dam 156 coming in contact with the underfill material 70 may have a configuration shown in FIG. 8 or FIG. 9.

In addition, the dam 156 can be formed by the same method as the manufacturing method of the first embodiment of the present invention.

Figure 14:
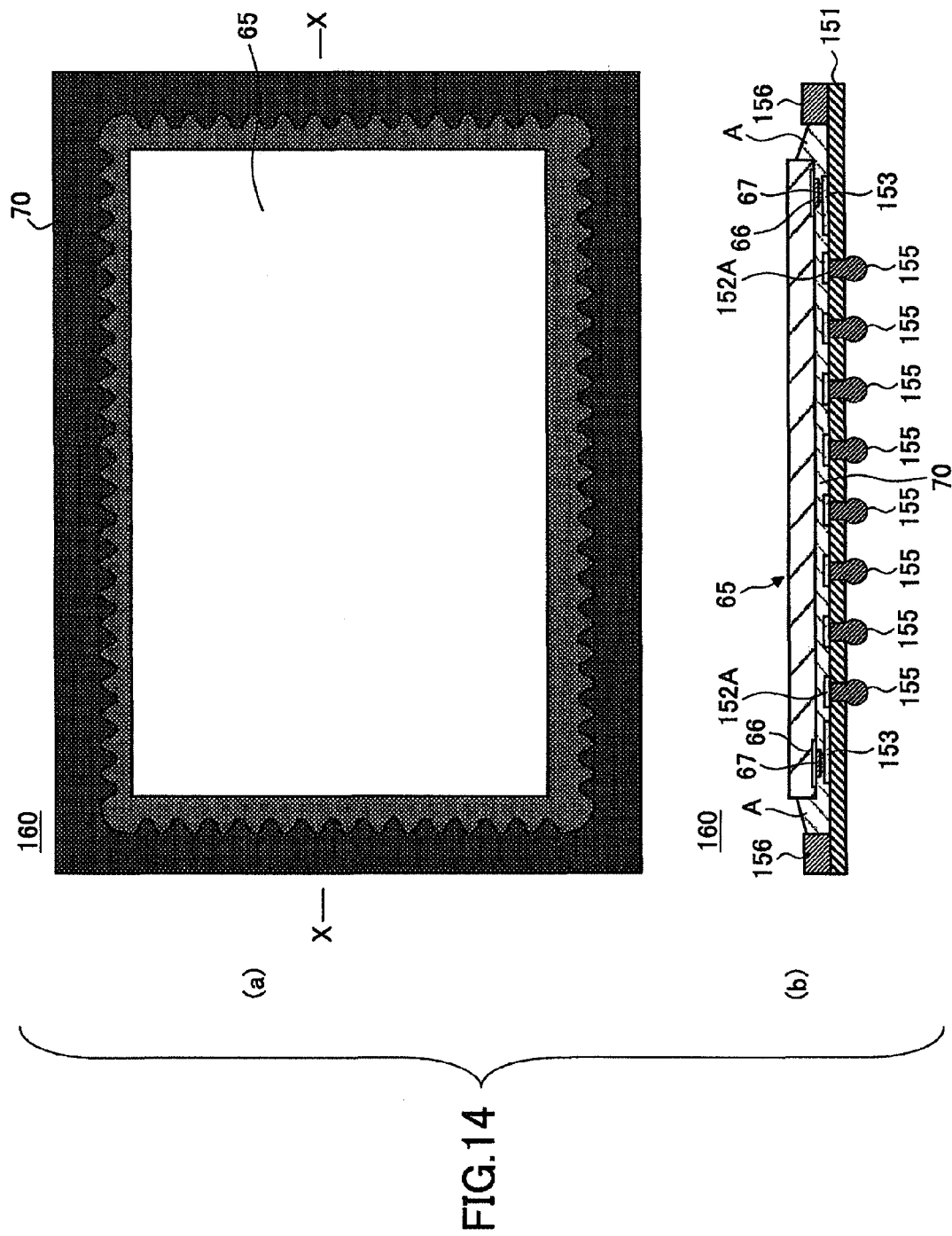
FIG. 14(a) is a plan view and FIG. 14(b) is a cross-sectional view showing a structure where a semiconductor element is flip-chip mounted on the wiring board shown in FIG. 13.

A structure where the semiconductor element 65 is flip-chip mounted on the wiring board 150 in a face-down manner is shown in FIG. 14. FIG. 14(b) shows a cross section taken along a line X-X in FIG. 14(a). In addition, since the semiconductor element 65 and the underfill material 70 have the same structures as the semiconductor element 65 and the underfill material 70 shown in FIG. 6, detailed explanation thereof is omitted.

Referring to FIG. 14, the semiconductor element 65 is mounted in the semiconductor element 65 mounting area indicated by an arrow B in FIG. 13, on the main (upper) surface of the wiring board 150 in a face-down manner. In addition, the bumps 67 of the semiconductor element 65 are connected to the bonding electrodes 153 of the wiring board 150.

In addition, the spherical electrode terminals 155 whose main bodies are solder are provided on the rear surface of the wiring board 150. The spherical electrode terminals 155 fill the piercing holes 154 and are connected to the end parts 152A of the wiring pattern.

The under fill material 70 is provided in a space between the wiring board 150 and a circuit element surface of the semiconductor element 65 and a space between the dam 156 and the external periphery part of the semiconductor element 65.

Because of this, the space between the wiring board 150 and a circuit element surface of the semiconductor element 65 and the space between the dam 156 and the external periphery part of the semiconductor element 65 are sealed, and the semiconductor element 65 is fixed to the wiring board 150.

In this embodiment, as shown in FIG. 13, the dam 156 surrounds the semiconductor element 65 mounting area with a substantially rectangular shape and four corners of the rectangular shaped dam 156 are positioned furthest from the semiconductor element 65 mounting area.

Thus, the fillet A of the underfill material 70 is formed with a longer skirt shape.

Generally, in a case where the semiconductor element is flip-chip mounted on the wiring board, the greatest amount of the stress concentrates on the four corners of the area surrounding the semiconductor element. However, in this example, the fillet A of the underfill material 70 at the four corners is formed in a large manner. Therefore, it is possible to sufficiently secure the connection strength between the underfill material 70 and the wiring board 150. Hence, it is possible to improve the reliability of the semiconductor device.

Next, a method for mounting the semiconductor element 65 on the wiring board 150 is discussed with reference to FIG. 15.

Figure 15:
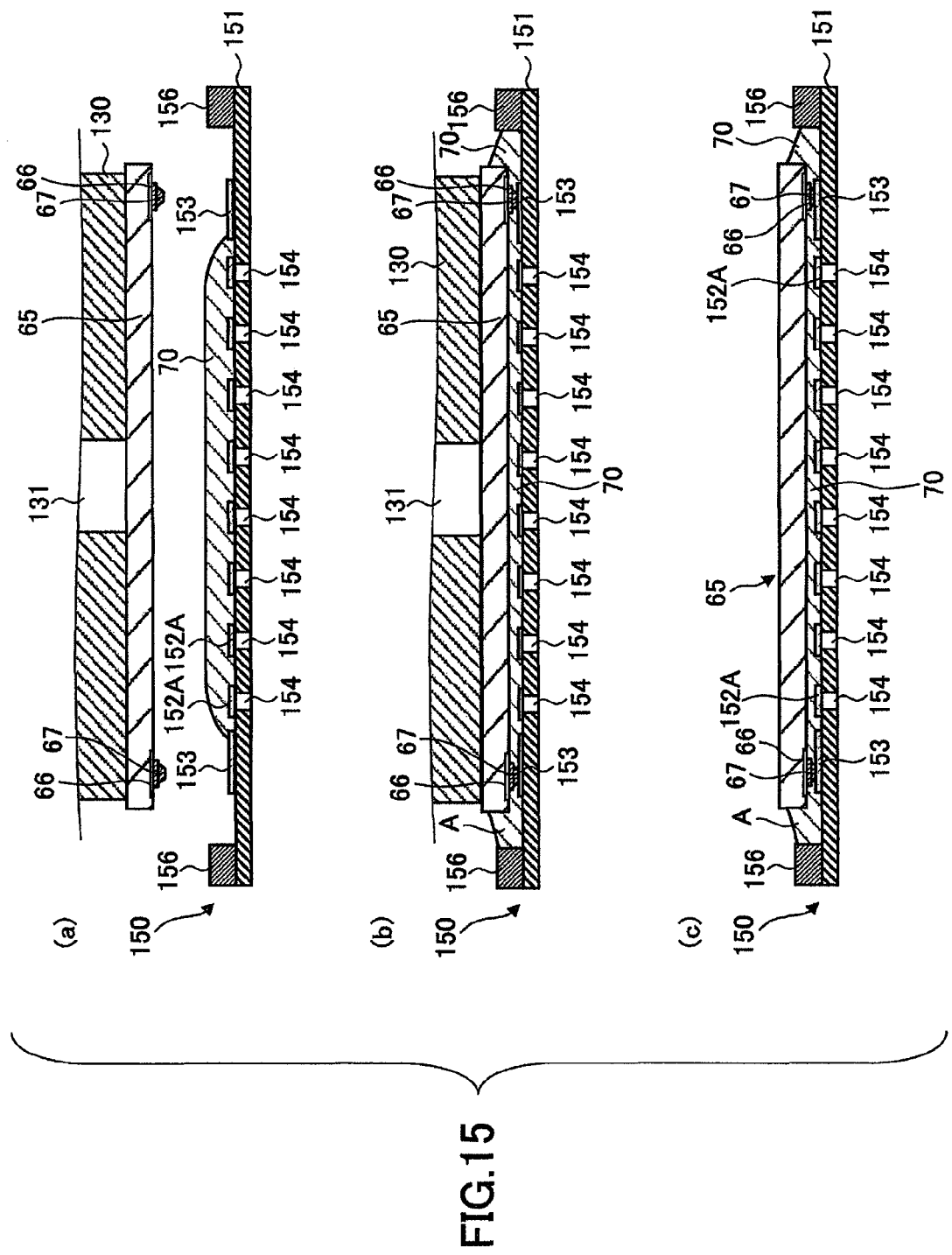
FIG. 15 is a cross-sectional view showing steps of mounting the semiconductor element on the wiring board shown in FIG. 13.

First, the wiring board 150 is held by suction on a bonding stage (not shown in FIG. 15). At this time, the bonding stage may be heated so that the wiring board 150 may be heated at approximately 50° C. through 100° C.

The wiring patterns 152 including the bonding electrodes 153 are formed on the upper surface of the wiring board 150.

The dam 156 having a configuration in plan view where the arc parts continue is formed on the upper surface of the wiring board 150, so as to surround the forming area of the wiring patterns 152.

Next, the underfill material 70 is selectively provided in the area surrounded by the dam 156 on the upper surface of the wiring board 150.

On the other hand, the semiconductor element where the bumps 67 are formed on the electrode pads 66 by the same method as that used in the first embodiment of the present invention is held by suction on the bonding tool 130 via the suction hole 131.

Then, the bumps 67 of the semiconductor element 65 and the bonding electrodes 52 of the wiring board 50 are positioned so as to face each other. See FIG. 15(*a*).

Next, the bonding tool 130 is lowered so that the bumps 67 of the semiconductor element 65 are pushed to and contact with the bonding electrodes 153 of the wiring board 150.

In other words, a load of, for example, approximately 10 gf/bump through 200 gf/bump is applied to the bumps 67 of the semiconductor element 65 and the underfill material 70 flows onto the entire surface of the rear surface of the semiconductor element 65. The underfill material 70 is provided in a space between the semiconductor element 65 and the wiring board 150 and in the external periphery part of the side surface of the semiconductor element 65. See FIG. 15(*b*).

At this time, the semiconductor element may be fixed to the wiring board via the underfill material 70 by using a method applying supersonic sound waves to the semiconductor element 65 or a method applying the load and the supersonic sound waves without heating instead of the method applying the load or heat.

Next, the underfill material 70 is heated and cured completely by using an oven or the like. In this process, the heating temperature can be, for example, approximately 120° C. through 200° C.; and the heating time period can be, for example, approximately 30 minutes through 90 minutes.

Because of this, the semiconductor element 65 is flip-chip mounted on the wiring board 50. See FIG. 15(*c*). If the underfill material 70 is cured completely in the process shown in FIG. 15(*b*), the process shown in FIG. 15(*c*) is not necessary.

After that, plural solder balls forming spherical electrode terminals are provided on the rear surface of the wiring board 150, so that the semiconductor device 160 shown in FIG. 14(*b*) is formed.

Third Embodiment of the Present Invention

Figure 16:
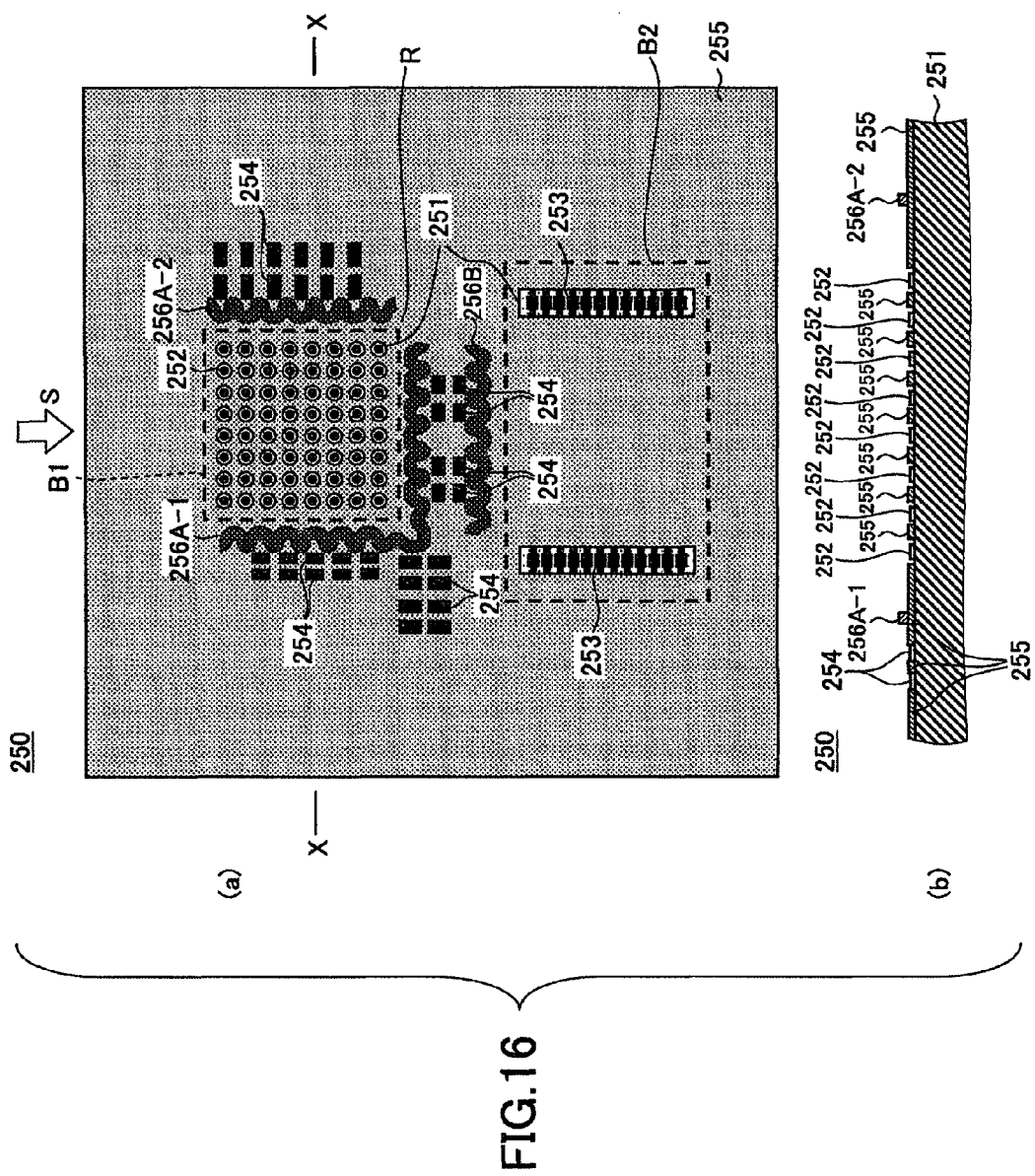
FIG. 16(a) is a plan view and FIG. 16(b) is a cross-sectional view showing a structure of a wiring board of a third embodiment of the present invention.

A structure of a wiring board of the third embodiment of the present invention is shown in FIG. 16. FIG. 16(*b*) shows cross section taken along a line X-X of FIG. 16(*a*). Areas surrounded by a dotted line B1 and a dotted line B2 in FIG. 16(*a*) indicate mounting areas of semiconductor elements on the wiring board.

Referring to FIG. 16(*a*) and FIG. 16(*b*), in a wiring board 250 of the third embodiment of the present invention as well as the wiring board 50 of the first embodiment of the present invention, wiring patterns are selectively provided on both surfaces of a substrate base 251 so that a multilayer structure is formed. The substrate base 251 is made of an organic resin material, an inorganic material such as ceramic or glass, or a semiconductor material such as silicon (Si). The wiring pattern is made of copper (Cu), aluminum (Al), or the like.

FIG. 16 mainly shows an upper surface of the wiring board 250. Illustration of the rear surface of the wiring board 250 is omitted.

Plural electrodes 252 for bumps are provided in a grid (matrix) in the area indicated by the dotted line B1 on the upper surface of the wiring board 250. On the other hand, in the area indicated by the dotted line B2, plural lines of the bonding electrodes 253 as parts of the wiring patterns are provided. The outside connection terminals 254 are provided in the vicinity of the periphery of the area indicated by the dotted line B1, in the vicinity of the periphery of the area indicated by the dotted line B2, and a space between the area indicated by the dotted line B1 and the area indicated by the dotted line B2.

The wiring patterns, electrode terminals 252 and 253, and the outside connection terminals 254 are formed by a photo-etching method, selective etching method, or the like.

A double-layer plating layer formed by nickel (Ni)/gold (Au) or a triple-layer plating layer formed by copper (Cu)/ nickel (Ni)/gold (Au) from the bottom may be formed on surfaces of the electrodes 252 and 253 and the outside connection terminals 254, by an electrolytic plating method or an electroless plating method. A remeltable conductive material made of solder, conductive resin or the like may be formed on the surfaces of the electrodes 252 and 253 and the outside connection terminals 254. The conductive member is formed by a printing method, transferring method, evaporation method, chemical reaction depositing method, or the like.

An insulating resin layer 255 is provided on an uppermost layer of the multilayer wiring structure of the wiring board 250. For example, the insulating resin layer is made of epoxy resin, acrylic resin, polyimide resin, or a mixture of these resins.

The insulating resin layer 255 is formed by forming, for example, a photosensitive resist material on the surface of the wiring board 250 by a printing method, a spray coating method, a laminating method using a thermal roll, a spin coat method, or the like. An opening pattern is formed by using a photolithography method, a screen printing method, or the like. As a result of this, the electrodes 252 and 253 and the outside connection terminals 254 are exposed in openings.

In this embodiment, dams 256A (256A-1 and 256A-2) are provided in a space between the area indicated by the dotted line 31 and the outside connection terminals 254. In addition, dam 256B is selectively provided in a space between the area indicated by the dotted line B2 and the outside connection terminals 254.

The dams 256 (256A-1, 256A-2) are configured to block the unnecessary flow of the underfill material 70A supplied in a direction indicated by an arrow S to the outside connection terminals 254 after the semiconductor element 265 is flip-chip mounted on the area indicated by the dotted line B1. On the other hand, the dam 256B is configured to block the unnecessary flow of the underfill material 70B to the outside connection terminals 254 when the semiconductor element 265 is flip-chip mounted on the area indicated by the dotted line B2.

In FIG. 16(*a*), the dam 256A is separated at a point indicated by "R". This is because the outside connection terminals 254 are not provided at the point indicated by "R". The dam 256A-1 and the dam 256A-2 may be continuously formed in a body.

In this embodiment, the dam 256A and 256B have configurations in plan view where substantially sine curve parts continue.

The configuration in plan view of the dam 256 may have a configuration shown in FIG. 8 or FIG. 9.

In addition, the dam 256 can be formed by the same method as the manufacturing method of the first embodiment of the present invention.

Figure 17:
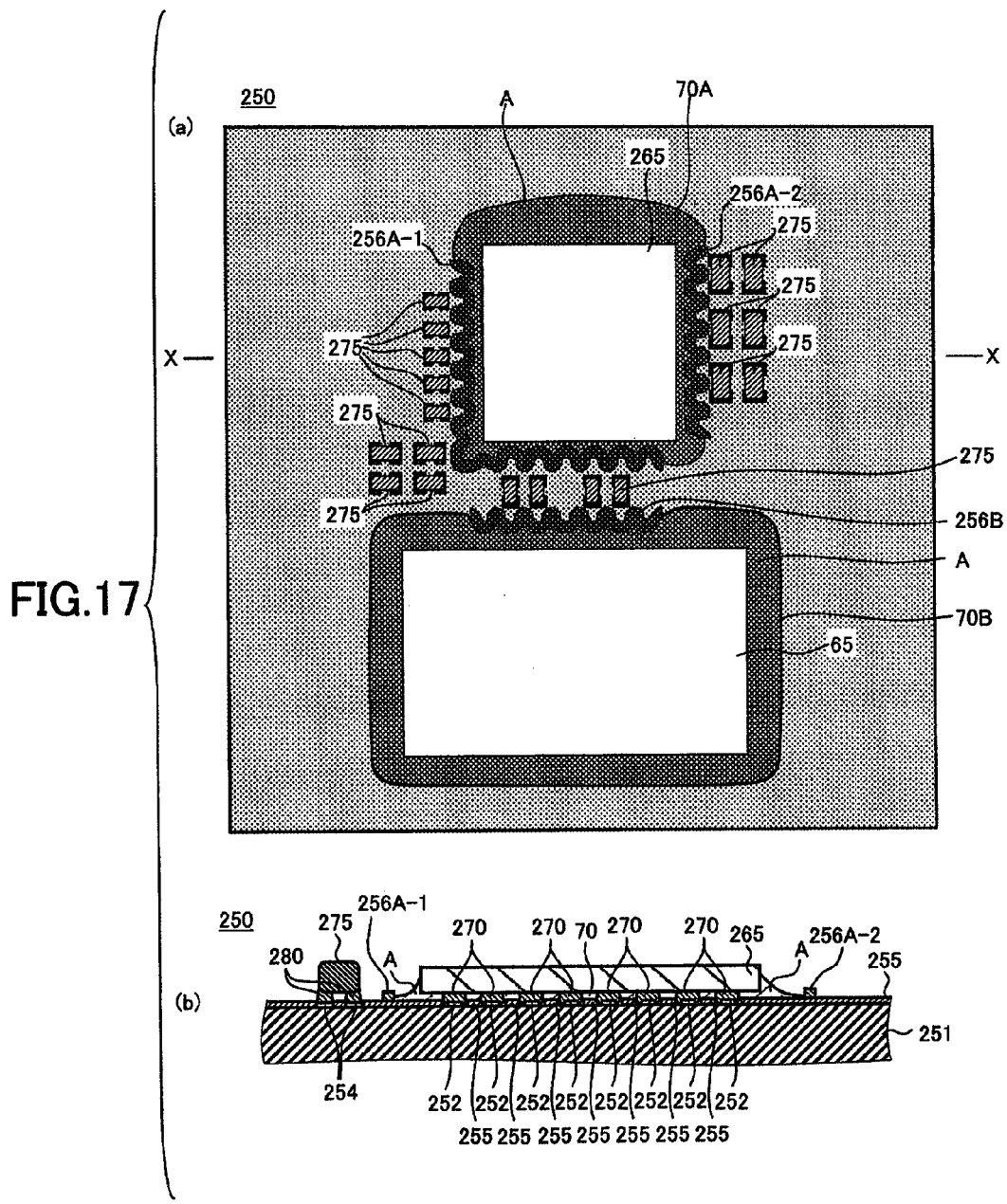
FIG. 17(a) is a plan view and FIG. 17(b) is a cross-sectional view showing a structure where a semiconductor element is flip-chip mounted on the wiring board shown in FIG. 16.

A structure where the semiconductor element 65 and the semiconductor element 265 are flip-chip mounted on the wiring board 250 in a face-down manner and passive element components are fixed on the outside connection terminals 254 is shown in FIG. 17. FIG. 17(*b*) shows a cross section taken along a line X-X in FIG. 17(*a*). FIG. 17 mainly shows an upper surface of the wiring board 250. Illustration of the rear surface of the wiring board 250 is omitted.

Referring to FIG. 17, the semiconductor element 265 is mounted in the semiconductor element mounting area indicated by an arrow Bi in FIG. 16, on the main (upper) surface of the wiring board 250 in a face-down manner. The bumps 270 of the semiconductor element 265 are connected to the bonding electrodes 252 of the wiring board 250.

On the other hand, the semiconductor element 65 is mounted in the semiconductor element mounting area indicated by an arrow B2 in FIG. 16, on the main (upper) surface of the wiring board 250 in a face-down manner. The bumps (not shown) of the semiconductor element 65 are connected to the bonding electrodes 253 of the wiring board 250.

In addition, the passive element components 275 such as chip capacitors or chip resistors are mounted on the outside connection terminals 254 situated on the wiring board 250 via solders 280.

The underfill material 70A is provided in a space between the wiring board 250 and a circuit element surface of the semiconductor element 265 and at the periphery part of the semiconductor element 265. Because of this, the space between the wiring board 250 and a circuit element surface of the semiconductor element 265 and the periphery part of the semiconductor element 265 are sealed, and the semiconductor element 265 is fixed to the wiring board 250.

Since the underfill material 70B provided between the semiconductor element 65 and the wiring board 250 has the same structure as that shown in FIG. 6, detailed explanation thereof is omitted.

For supplying the underfill material 70 (70A and 70B), the dams 256 are provided between the semiconductor element 265 mounting area B1 and a place where the outside connection terminals 254 are provided and between the semiconductor element 265 mounting area B2 and the place where the outside connection terminals 254 are provided. Due to the dams 256, the flow of the underfill material 70 is prevented and therefore the underfill material 70 does not reach the outside connection terminals 254 to which the passive element components 275 are connected.

In other words, since the flow of the underfill material 70 to the outside connection terminals 254 is blocked by the dams 256, it is possible to provide the outside connection terminals 254 close to the semiconductor element 265 and the semiconductor element 65. Because of this, the distance between the passive element components 275 mounted on the outside of the connection terminals 254 and the semiconductor element 265 or 65, the distance between the passive element components 275 mounted on the outside connection terminals 254 and the semiconductor element 265 or 65 to each other can be shortened. Therefore, it is possible to improve the electrical properties of the semiconductor elements 265 and 65.

On the other hand, the underfill material 70 (70A and 70B) flows greatly in the area where the dam 256 is not provided, so that a large fillet A is formed. Accordingly, the area where the underfill material 70 and the wiring board 250 come in contact with each other, that is a skirt shaped expansion of the underfill material 70 in the periphery of the semiconductor elements 265 and 65 is large. Therefore, the adhesiveness of the underfill material 70 and the wiring board 150 is improved so that high reliability of the semiconductor device can be obtained.

Figure 18:
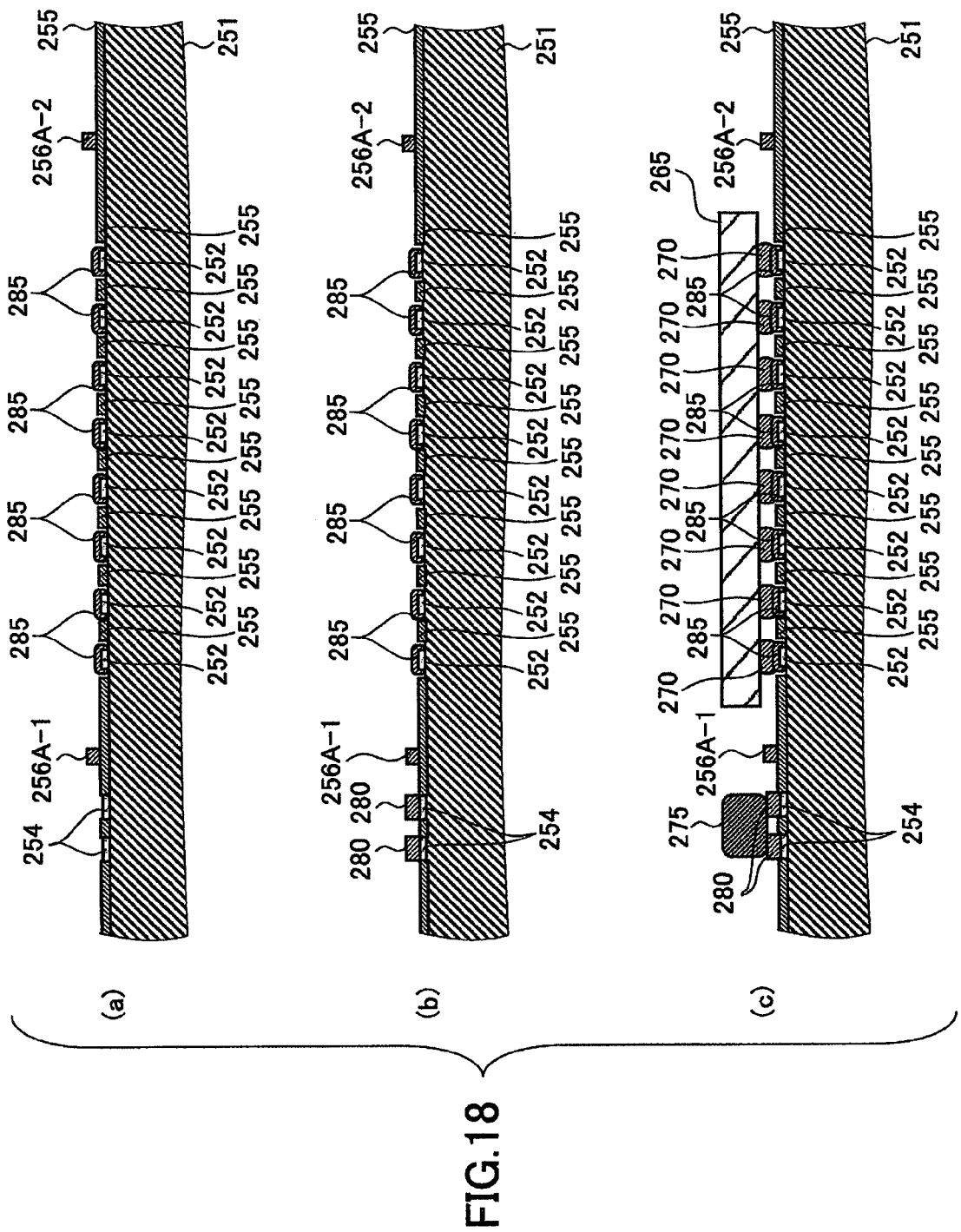
FIG. 18 is a first cross-sectional view showing steps of mounting the semiconductor element on the wiring board shown in FIG. 16.
Figure 19:
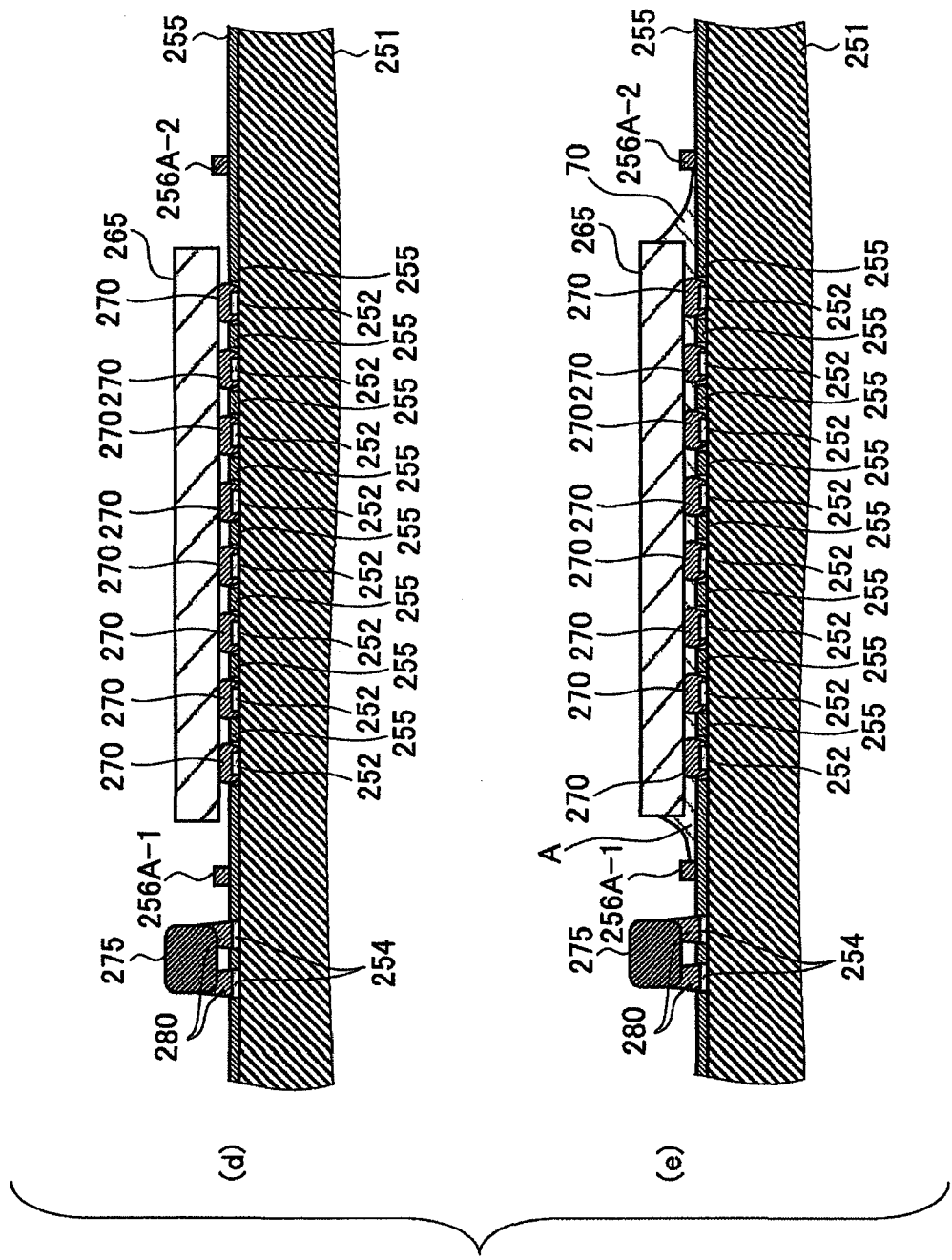
FIG. 19 is a second cross-sectional view showing steps of mounting the semiconductor element on the wiring board shown in FIG. 16.

Next, a method for mounting the semiconductor element 265 and the passive element components 275 on the wiring board 250 is discussed with reference to FIG. 18 and FIG. 19. Since the semiconductor element 65 is mounted on the wiring board 250 by using the same method as that for the semiconductor element 265 or by using the same method as that shown in FIG. 15, detailed explanation thereof is omitted.

First, a remeltable conductive member 285 made of solder, conductive resin, or the like is formed on the surface of the electrodes 252 of the wiring board 250. See FIG. 18(*a*).

Next, cream solder 280 is selectively provided on the outside connection terminal 254 of the wiring board 250 by using a mask printing method. See FIG. 18(*b*).

Next, after the semiconductor element 265 and the wiring board 250 are positioned by using a flip-chip bonder so that the solder bumps 270 of the semiconductor element 265 and the electrodes 252 of the wiring board 250 face each other, the semiconductor element 265 is mounted on the wiring board 250.

On the other hand, after the passive element components 275 and the wiring board 250 are positioned so that the passive element components 275 and the outside connection terminals 254 of the wiring board 250 face each other, the passive element components 275 are mounted on the wiring board 250. See FIG. 18(c).

Flux is adhered on the head end of the solder bump 270 formed on the electrode pads (not shown) of the semiconductor element 265, by the transferring method to the like. Due to the viscosity of the flux, the mounting position of the semiconductor element 265 is held. In addition, the mounting position of the passive element components 275 are held due to the viscosity of the cream solder 280.

Next, the wiring board 250 where the semiconductor element 265 and the passive element component 275 are mounted is heated by the reflow oven or the like so that the solders 280 and 285 are made molten. The heating conditions are, for example, a nitrogen environment and a peak temperature of approximately 220° C. through 250° C.

After that, the temperature is decreased so that the semiconductor element 265 and the passive element components 275 are fixed on the electrodes of the wiring board 250. See FIG. 19(d). After the reflow process is completed, if necessary, a cleaning process using a cleaning solvent such as pure water, alternatively chlorofluorocarbon such us HCFC (hydrochlorofluorocarbon) or alcohol, is implemented.

Next, the paste underfill 70 is supplied, via the nozzle 132, to the space between the semiconductor element 265 and the wiring board 250 and the periphery of the side surface of the semiconductor element 265. See FIG. 19(e).

At this time, due to the dam 256A, the flow of the underfill material 70 to the outside connection terminals 254 where the passive element components 275 are connected is blocked.

After this, the underfill material 70 is heated and cured by the oven or the like so that the semiconductor elements 265 and 65 are fixed on the wiring board 250.

Thus, according to the above-discussed embodiments of the present invention, the electronic component is flip-chip mounted on the surface of the wiring board and the underfill is provided between the electronic component and the surface of the wiring board. In other words, according to the above-discussed embodiments of the present invention, the electronic component is mounted on the surface of the wiring board by the bump connection and is connected to the wiring board by the underfill. The providing area of the underfill is defined by the dam.

In addition, because of the way of providing the dam of the embodiments of the present invention, a sufficient expansion is provided to the fillet of the underfill material and delamination at the interface between the underfill material and the dam is prevented. Accordingly, it is possible to obtain high reliability and enable miniaturization of the electronic apparatus.

Although the invention has been described with respect to specific embodiments for a complete and clear disclosure, the appended claims are not to be thus limited but are to be construed as embodying all modifications and alternative constructions that may occur to one skilled in the art that fairly fall within the basic teachings herein set forth.

This patent application is based on Japanese Priority Patent Application No. 2007-20081 filed on Jan. 30, 2007, the entire contents of which are hereby incorporated by reference.

What is claimed is:

1. A wiring board where an electronic component is mounted on a main surface via a bump and at least a part of the periphery of the electronic component is covered with resin, the wiring board comprising:
   a dam provided at least at a part of the periphery of an area where the electronic component is mounted, on the main surface of the wiring board;
   wherein the dam has a configuration where a curved line is continuously formed, an internal wall surface that comes in contact with the resin, and has any one of a wave-shaped configuration, a saw-tooth configuration with teeth shapes having acute angles, and a configuration with substantially rectangular shaped cuttings.

2. The wiring board as claimed in claim 1, wherein, at least a part of the dam is provided along the periphery of the area where the electronic component is mounted on the wiring board.

3. The wiring board as claimed in claim 2, wherein the dam is provided in a substantially rectangular shape to surround the electronic component, and four corners of the rectangular shaped dam are positioned furthest from the area of the wiring board where the electronic component is mounted.

4. The wiring board as claimed in claim 1, wherein the dam includes insulating resin.

5. The wiring board as claimed in claim 4, wherein an insulating resin layer having a designated opening pattern configuration is provided on a surface of the wiring board where the electronic component is mounted, and the dam is provided on the insulating resin layer.

6. The wiring board as claimed in claim 5, wherein the dam is made of the same material as the insulating resin layer.

7. The wiring board as claimed in claim 1, wherein the dam has a double-layer structure;
   an internal wall surface of a lower layer dam, the internal wall surface coming in contact with the resin, has a continuous wave-shaped configuration; and
   an internal wall surface of an upper layer dam, the internal wall surface coming in contact with the resin, has a configuration where neighboring wave-shaped curved parts are shifted against the configuration of the internal wall surface of the lower layer dam.

8. The wiring board as claimed in claim 1, wherein an outside connection terminal is provided outside the dam, on the surface of the wiring board where the electronic component is mounted.

9. The wiring board as claimed in claim 8, wherein the dam has a configuration corresponding to the external configuration of the outside connection terminal.

10. The wiring board as claimed in claim 8, wherein the dam has a configuration where a part situated between neighboring outside connection terminals is far from the area where the electronic component of the wiring board is mounted.

11. A semiconductor device, comprising:
    a wiring board; and
    a semiconductor element mounted on a main surface of the wiring board via a bump;
    wherein a dam is provided at least at a part of the periphery of the semiconductor element on a main surface of the wiring board;
    the dam has a configuration where a curved line is continuously formed; and
    resin is formed on a surface of the wiring board between the semiconductor element and the dam, and
    wherein an internal wall surface of the dam comes in contact with the resin and has any one of a wave-shaped configuration, a saw-tooth configuration with teeth shapes having acute angles, and a configuration with substantially rectangular shaped cuttings.

12. The semiconductor device as claimed in claim 11, wherein an outside connection terminal is provided outside the dam, on the surface of the wiring board where the semiconductor element is mounted; and a second semiconductor element is stacked on the semiconductor element and connected to the ooutside connection terminal.

13. The semiconductor device as claimed in claim 12, wherein a passive element component is mounted on the outside connection terminal.

* * * * *